(12) United States Patent
Hilt et al.

(10) Patent No.: US 10,636,632 B2
(45) Date of Patent: Apr. 28, 2020

(54) METHOD FOR FORMING PEROVSKITE LAYERS USING ATMOSPHERIC PRESSURE PLASMA

(71) Applicant: The Board of Trustees of the Leland Stanford Junior University, Palo Alto, CA (US)

(72) Inventors: Florian Hilt, San Jose, CA (US); Michael Q. Hovish, Mountain View, CA (US); Nicholas Rolston, Stanford, CA (US); Reinhold H. Dauskardt, Menlo Park, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 75 days.

(21) Appl. No.: 15/874,527

(22) Filed: Jan. 18, 2018

(65) Prior Publication Data
US 2018/0204709 A1 Jul. 19, 2018

Related U.S. Application Data

(60) Provisional application No. 62/447,747, filed on Jan. 18, 2017.

(51) Int. Cl.
| | |
|---|---|
| *C30B 1/02* | (2006.01) |
| *H01J 37/32* | (2006.01) |
| *H01L 31/18* | (2006.01) |
| *H01L 33/00* | (2010.01) |
| *H01L 31/032* | (2006.01) |

(52) U.S. Cl.
CPC .. *H01J 37/32825* (2013.01); *H01J 37/32055* (2013.01); *H01J 37/32073* (2013.01); *H01J 37/32192* (2013.01); *H01J 37/32348* (2013.01); *H01L 31/032* (2013.01); *H01L 31/186* (2013.01); *H01L 31/1872* (2013.01); *H01L 33/0095* (2013.01); *Y02E 10/50* (2013.01)

(58) Field of Classification Search
CPC ................ C30B 1/00; C30B 1/02; C30B 1/04
See application file for complete search history.

(56) References Cited

U.S. PATENT DOCUMENTS

| | | | |
|---|---|---|---|
| 6,730,575 B2 | 5/2004 | Eldridge | |
| 10,193,092 B2* | 1/2019 | Huang | ................ H01L 51/4213 |
| 2010/0207512 A1* | 8/2010 | Miyagawa | ......... C09K 11/7774 |
| | | | 313/503 |

OTHER PUBLICATIONS

Liang et al., "Fabrication of organic-inorganic perovskite thin films for planar solar cells via pulsed laser deposition", Jan. 2016, AIP advances v6, pp. 015001-1 to 015001-7.
Hilt et al., "Rapid Processing of Robust Perovskite Photovoltaics in Air by Atmospheric Pressure Plasma Jet", Jul. 2017, ISPC 23 proceedings.

* cited by examiner

*Primary Examiner* — Robert M Kunemund
(74) *Attorney, Agent, or Firm* — Lumen Patent Firm

(57) ABSTRACT

Improved deposition of optoelectronically active perovskite materials is provided with a two step process. In the first step, precursors are deposited on a substrate. In the second step, the deposited precursors are exposed to an atmospheric pressure plasma which efficiently cures the precursors to provide the desired perovskite thin film. The resulting films can have excellent optical properties combined with superior mechanical properties.

15 Claims, 13 Drawing Sheets

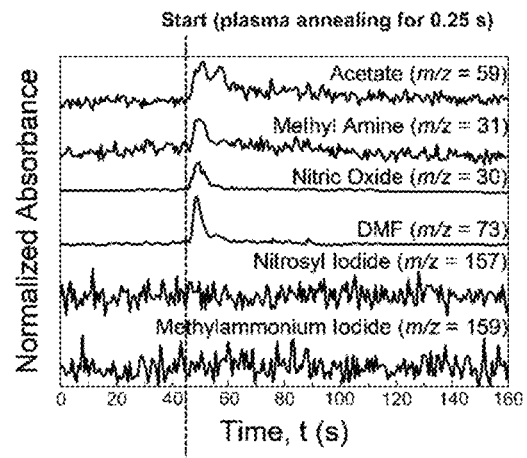 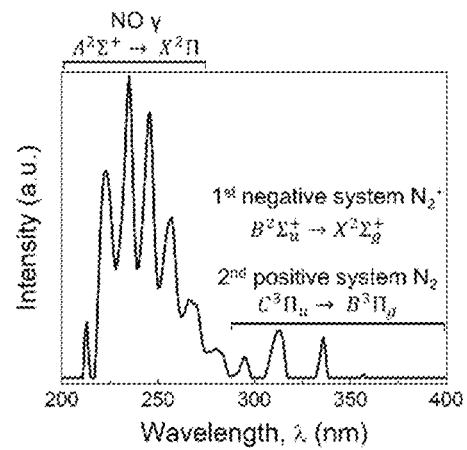
FIG. 5A    FIG. 5B
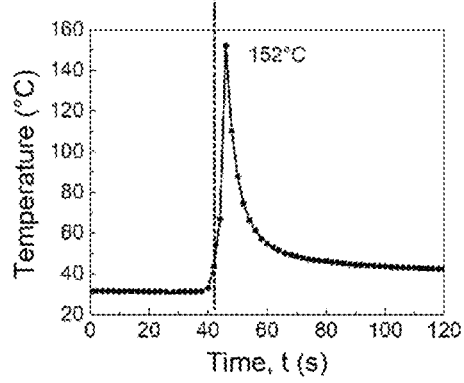 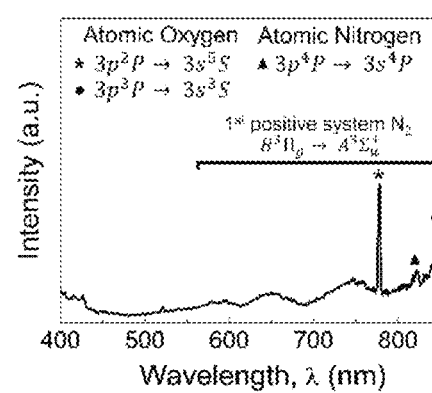
FIG. 5D    FIG. 5C

US 10,636,632 B2

METHOD FOR FORMING PEROVSKITE LAYERS USING ATMOSPHERIC PRESSURE PLASMA

CROSS REFERENCE TO RELATED APPLICATIONS

This application claims the benefit of U.S. provisional patent application 62/447,747, filed on Jan. 18, 2017, and hereby incorporated by reference in its entirety.

GOVERNMENT SPONSORSHIP

This invention was made with Government support under contract DE-EE0004946 awarded by the Department of Energy. The Government has certain rights in the invention.

FIELD OF THE INVENTION

This invention relates to deposition of optoelectronically active perovskite materials.

BACKGROUND

Perovskite materials are of interest for various applications in optoelectronics. However, it remains difficult to provide these materials such that sufficient device performance is provided simultaneously with required mechanical properties, such as fracture resistance. Some early work in perovskite deposition relates to non-optoelectronic devices, but such work is often not relevant for deposition of optoelectronically active perovskite materials. Performance of optoelectronic devices is often acutely sensitive to the presence of defects (e.g., non-radiative recombination centers) that can have minimal effect on performance of non-optoelectronic devices. Thus old deposition techniques for perovskite materials may or may not work for optoelectronic devices in a manner that is difficult to predict in advance. Accordingly, it would be an advance in the art to provide improved methods for forming optoelectronically active perovskite thin films.

SUMMARY

Improved deposition of optoelectronically active perovskite materials is provided with a two step process. In the first step, precursors are deposited on a substrate. In the second step, the deposited precursors are exposed to an atmospheric pressure plasma which efficiently cures the precursors to provide the desired perovskite thin film. We have found the resulting films can have excellent optical properties combined with superior mechanical properties.

BRIEF DESCRIPTION OF THE DRAWINGS

FIGS. 5A-5I show results pertaining to the experiment of section B.

DETAILED DESCRIPTION

Section A describes general principles relating to embodiments of the invention, including alternatives and variations. Section B describes experimental results that demonstrate an exemplary embodiment of the invention. Section C is extended data relating to the experiment of Section B.

A) General Principles

A1) Main Points

Figure 1:
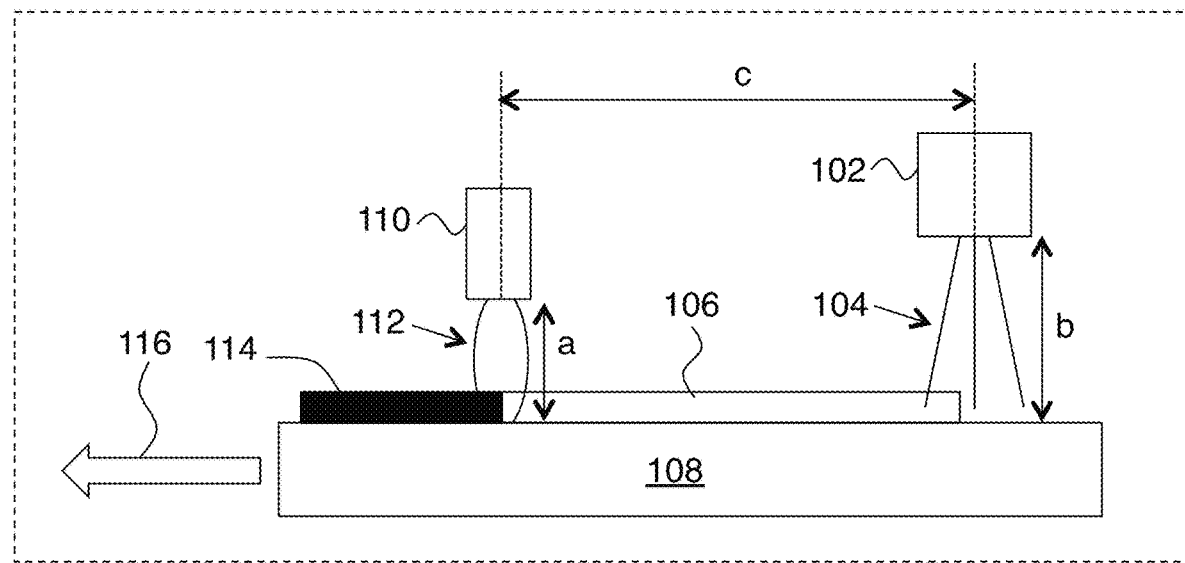
FIG. 1 shows an embodiment of the invention.

FIG. 1 shows an exemplary embodiment of the invention. In this example, material source 102 deposits one or more precursors 104 on a substrate 108 to provide deposited precursors 106. Plasma source 110 provides a plasma 112. Exposure of the deposited precursors 106 to plasma 112 forms an optoelectronically active layer 114 of a perovskite material. The plasma discharge is an atmospheric pressure plasma. We define an "atmospheric pressure plasma" as any plasma formed at or near atmospheric pressure. Here "near atmospheric pressure" is defined as atmospheric pressure +/−50%, more preferably atmospheric pressure +/−25%. The composition of the plasma can be the composition of air (i.e., $4/5$ nitrogen, $1/5$ oxygen) or different than the composition of air. Substrate 108 and sources 102 and 110 are usually in relative motion as indicated by arrow 116 during operation, so that motion of the substrate defines the time between deposition and plasma exposure and the duration of the plasma exposure. Alternatively, the substrate can be in a fixed position and the sources scanned over the substrate to deposit precursors and expose the deposited precursor to the plasma to form the film. Important dimensions in the design are shown on FIG. 1 as follows: a is the plasma nozzle-to-substrate distance, b is the spray nozzle-to-substrate distance and c is the plasma nozzle-to-spray nozzle distance.

The plasma discharge may be contained or open to the atmosphere. More specifically, the plasma discharge can be open to ambient air. Alternatively, the plasma discharge can be contained within an enclosure providing a controlled atmosphere. Such an enclosure is schematically shown by dashed line 118 on FIG. 1, where this line is dashed because enclosure 118 is optional.

In preferred embodiments, exposure of the deposited precursors to the plasma to form the optoelectronically active layer of a perovskite material simultaneously provides a) solvent removal, b) precursor bond rearrangement, and c) crystallization of perovskite structure, and d) evolution of reaction byproducts. This provides significant advantages compared to conventional fabrication approaches, as described in greater detail below.

Practice of the invention does not depend critically on what part of the plasma the deposited precursors are exposed to. Possibilities include but are not limited to:

exposing the deposited precursors directly to a plasma discharge, exposing the deposited precursors to an afterglow region of a plasma discharge and exposing the deposited precursors to a plasma jet region of a plasma discharge.

Figure 2A:
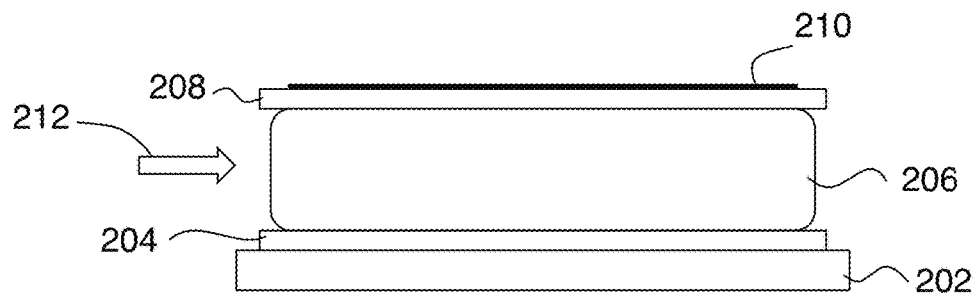
FIGS. 2A-B show two alternative way of providing a plasma discharge.

The plasma discharge can be provided by lateral injection as shown on FIG. 2A (side view). Here 202 is a movable stage, 204 is the substrate, 206 is the plasma discharge, 208 is a dielectric and 210 is an electrode. In this example, gas flows in from the side as shown by arrow 212, and the plasma is formed by a potential difference between electrode 210 and substrate 204. Alternatively, the plasma discharge can be provided by central injection, as in the example of FIG. 2B (side view). Here plasma discharge 228 is formed by applying a voltage between electrodes 220/222 (disposed within dielectrics 224 and 226, respectively) and the substrate 204, and gas flows between the electrodes as shown by block arrow 230. In these examples, substrate 204 may or may not be electrically grounded. Another option is angled injection where the incoming gas flow is provided at any angle (0 to 90 degrees) relative to the substrate.

Practice of the invention does not depend critically on the type of plasma discharge used. Options include but are not limited to: arc discharges, dielectric barrier discharges, corona discharges, radio-frequency capacitive discharges, microwave discharges, and inductive discharges.

Various methods can be used to provide deposited precursors on the substrate, including but not limited to: spraying, casting, printing, liquid deposition and vapor deposition.

Optoelectronically active perovskite layers according to embodiments of the invention have numerous applications, including but not limited to: active layers in solar cells, active layers in light emitting devices, active layers in light detecting devices, active layers in water splitting systems, active layers in non-linear optoelectronic devices, active layers in electrostriction-based devices, and active layers in photostriction-based devices, A2) Further Variations The following description is exemplary in nature and is no way intended to limit the present teachings, applications, or uses. It is an object of the invention to provide a method for forming a perovskite thin film on a substrate. FIG. 1 shows a schematic of an exemplary system for forming a perovskite layer, in accordance with various embodiments of the present disclosure. According to FIG. 1, a mixture 104 of a solvent, perovskite forming molecules, and/or perovskite crystallites, and/or additional chemicals, is deposited, sprayed or vaporized by source 102 onto substrate 108 to provide deposited precursors 106. The deposition system moves such that deposited precursors 106 enter a plasma zone in which the coated substrate is exposed to an atmospheric pressure plasma 112 from plasma source 110 to form perovskite film 114.

The mixture and/or the perovskite forming material may preferably be a gas, vapor, liquid, aerosol or solid. A wide range of plasma parameters (gas, power, duty cycle, frequency, plasma head velocity, distance from substrate, number of scans . . . ) can be adjusted to control the chemistry, morphology, and deposition rate of the thin films. The parameters can be tuned depending on the solution or properties that are required. The process described herein includes the deposition of semiconducting perovskite layers, wherein the method comprises a perovskite-forming solution deposited (sprayed, vaporized, or cast) on at least a portion of a substrate, followed by an atmospheric pressure plasma applied to the surface portion to form a perovskite layer. As a non-limiting proof of concept, we have implemented a new process to synthesize methylammonium lead halide perovskite films by taking advantages of plasma thermal energy and reactive species. Coatings derived from the described method have been used as active layers within photovoltaic devices and have proven to be an efficient means to obtain good power conversion efficiency and open circuit voltages exceeding 1 Volt.

The process can be divided in two subsequent steps: The perovskite-forming solution (e.g. methylammonium iodide, lead acetate, N,N-dimethylformamide) is sprayed onto the substrate by an ultrasonic atomizing nozzle. Then, the sprayed layer is cured by an atmospheric plasma discharge. This method enables large area deposition of crystalline perovskite films at high processing speeds, for example, capable of coating (deposition and cure) 1 $cm^2$ in one second. The atomizing nozzle evenly distributes the mixture onto the substrate's surface, maximizing film coverage upon curing.

This approach has various applications. Perovskite thin films are of particular interest within the photonic field, and the method described herein has already demonstrated efficient photoactive layers in an inverted PEDOT:PSS solar cell device. In the present embodiment, the semiconductor/optoelectronic/photonic device is typically a photovoltaic device. Alternatively, the semiconductor/optoelectronic/photonic device may be other than a photovoltaic device and may be for instance a light-emitting device, a ferroelectric device (BaTiO3), a superconductor device (YBaCuO3) (broadly speaking, any ionic conductivity device).

Existing methods for depositing perovskite thin films are constrained by major challenges. One significant challenge requires a controlled atmosphere in order to achieve optimal electrical properties and morphology. For example, organic-inorganic perovskite films are extremely hygroscopic and will in-take water from the atmosphere, accelerating degradation. Such degradation pathways can impede long term performance in a number of applications. Another prominent challenge to scalable processing of crystalline perovskite films is a slow cure speed.

Curing of perovskite films involves three processes, which may or may not occur simultaneously:
1. Solvent removal
2. A-C bond must be broken, where A-C represents the source of one of the cations in the precursor solution.
3. Crystallization of perovskite structure
4. Evolution of reaction byproducts.

Existing methods will typically separate the cure into two steps of (1) and (2-3), in spin coating for example. Some techniques will attempt steps (1-3) simultaneously, such as in spraying perovskite forming solution on a hot substrate. However, both of these methods cure the film by heating a thick substrate, impeding energy transfer to the perovskite forming solution. Additional time beyond crystallization is required to remove any remaining solvent. Furthermore, ionic bonding in perovskite crystals results in weakly bonded and brittle films. Additional concerns about environmental impacts arise from techniques which generate an excess of waste. For example, spin coating often requires an excess of solution which is mostly spun off, leaving the residue of a thin film behind. This waste contains water-soluble Pb2+ ions, which is a toxicity concern.

The method presented here adequately addresses many challenges currently faced in the production of perovskite thin films. Perovskites cured with atmospheric pressure plasma discharges may be cured in ambient environments, with a relative humidity in excess of 40%. Due to the high thermal, chemical, and photo reactivity of a discharge, water is effectively removed from the films, mitigating concerns of water incorporation during the formation of the perovskite material. Furthermore, perovskite films cured in this manner are cured in a top-down manner, as opposed to bottom-up which is observed in other perovskite forming techniques. That is to say, the energy transfer to the perovskite forming solution occurs through direct interaction with the plasma or plasma afterglow. As such, stages (1-3) of the curing process happen concomitantly, resulting in an extremely rapid curing process. With regards to the superior cohesion of these perovskite layers, our analysis (microscopy and diffraction) has indicated it results from multiple orientations of crystallites within the thin film. The somewhat polycrystalline nature of these films arises from rapid curing, resulting from a kinetically controlled process. In other methods (spin coating, spray coating, etc.), the process is thermodynamically controlled, with longer cure times facilitating a more homogenous crystallite composition. Additionally, the volume of perovskite forming solution required for this method is reduced compared to other methods, requiring volumes below 1 µL to coat 1 cm$^2$. Finally, the entirety of the sprayed precursor is converted to perovskite material, contributing to better chemical remediation and minimizing the amount of toxic waste material produced as a byproduct of the deposition process. In summation, advantages of the present approach based on curing perovskite forming precursor with an atmospheric pressure plasma discharge include: high-quality film formation in humid environments, significantly reduced curing times, superior mechanical properties, and improved chemical remediation. Also, compared to other processes, this method is especially suitable for upscaling. It is amenable to roll-to-roll and high-volume manufacturing and the machinery used (atmospheric plasma) is commonly used in industrial settings, meaning the process is readily adaptable to manufacturing-scale equipment.

Several variations are possible.

Perovskite/Perovskite Forming Solution: The solution composition can vary to tune the chemistry of the perovskite. In an optoelectronic device such as a photovoltaic device, the perovskite layer is a part of the photoactive region which comprises: An n-type region comprising at least one n-type layer; A p-type region comprising at least one p-type layer; A layer of an intrinsic, undoped perovskite semiconductor, wherein this latter has a band gap between 0.5 and 3.0 eV.

As used herein, the term 'n-type region', refers to a region of one or more electron-transporting materials. Similarly, the term 'n-type layer' refers to a layer of an electron-transporting material. An electron-transporting material could be a single electron-transporting compound or elemental material, or a mixture of two or more electron-transporting compounds or elemental materials. An electron-transporting compound or elemental material may be undoped or doped with one or more dopant elements. As used herein, the term 'p-type region' refers to a region of one or more ion or hole-transporting materials. This region comprises a p-type layer and occasionally a p-type exciton blocking layer. The term 'p-type layer' refers to a layer of an ion or hole-transporting material. An ion or hole-transporting material could be a single ion or hole-transporting compound or elemental material, or a mixture of two or more ion or hole-transporting compounds or elemental materials. An ion or hole-transporting compound or elemental material may be undoped or doped with one or more dopant elements.

As used herein, the term 'perovskite' refers to a material or a layer with a three-dimensional crystal structure related to that of CaTiO3 or CaTiC. The skilled person will appreciate that a perovskite material can be represented by the formula 'A''B''X'3, wherein 'A' is at least one cation, 'B' is at least one cation, and 'X' is at least one anion. The cation 'A' can be organic, inorganic, or an organic-inorganic cation. When the cation 'A' is organic, the organic cation can have the formula (R1R2R3R4N)n+ or (R5R6N=CH—NR7R8)n+, where R is hydrogen, unsubstituted or substituted alkyl, or unsubstituted or substituted aryl, and n is equal or superior to one (e.g. 'CH3NH3'+ refers as MA, 'HC(NH2)2'+ refers as FA, 'C(NH2)3'+ refers as GA). When the cation 'A' is inorganic, the cation can be selected from the group consisting of Ag+, Li+, Na+, K+, Rb+, Cs+, Be2+, Mg2+, Ca2+, Pb2+, Sr2+, Ba2+, Fe2+, Sc3+, Y3+, and La3+. The cation can be used as a single or multiple ion (e.g. (Mg,Fe)SiO3), YBaCuO3).

When the cation 'A' is organic-inorganic, the cation can be used as a single or multiple ion such as 'A'=(M1n(R21-xR3x) (100-n)), where R is preferably an organic cation as described above and M is preferably an inorganic cation comprised as described above (e.g. FA1-xGax'B''X'3, Csx(MAnFA1-n) (100-x) 'B''X'3).

The cation 'B' can be a metal cation selected from the group consisting of Pb2+, Sn2+, Ge2+, Bi2+, Cu2+, Au2+, Ag2+, Sb2+, Nb2+, Ti2+, Mg2+, Si2+, Ca2+, Sr2+, Cd2+, Ni2+, Mn2+, Fe2+, Zr4+, Co2+, Pd2+, Yb2+, Eu2+, Ce4+, and Tb4+. The divalent metal bearing compound can be derived from various salts including but not limited to lead acetate and lead nitrate for instance. The anion 'X' can be selected from the group consisting of halide anions comprising Cl—, Br—, I—, F—, or chalcogenide anions comprising O2-, S2-, Se2-, Te2-, or polyanions comprising BF4-, PF6-, SCN—. The anion can be used as a single or multiple ions such as 'X'=(R1-xRx), where R is an anion as listed above. Other type of perovskite that can be elaborated: Cuprate perovskite (La2-xBaxCuO4, YBa2Cu3O7, Ba2MCu3O7, where M is a rare earth ion such as Pr, Y, Nd, Sm, Gd, Dy, Ho). Metal perovskite can be produced based on a RT3M structure, where R is a rare-earth ion, T is a transition metal ion (Pd, Rh, Ru) and M is a light metalloid (e.g. B, C).

The mixture may preferably comprise at least one organic solvent. The solvent may for example be selected from the group consisting of: Acetic acid, Acetone, Acetonitrile, n-Butanol, n-Butyrolactone, n-Pentanol, n-Propanol, n-Octanol, 2-Methyl-2-Propanol, Butylacetate, Chlorobenzene, Chloroform, Cyclohexane, Dichloromethane, Diethylether, 1,2-Dichloroethylene, Diisopropylether, Dimethylacetamide, Dimethylethanolamine, Dioxane, N,N-Dimethylformamide, Dimethyl sulfoxide, Ethanol, Ethylacetate, Ethylene glycol, Ethylmethylketone, Heptane, 15 Hexamethylphosphoramide, Hexane, Isopropylalcohol, 3-Methyl-1-Butanol, Methanol, Methylamine, Methylenechloride, N-methylpyrrolidone, Pentane, n-Propylalcohol, Propylene carbonate, Pentachloroethane, 1,1,2,2-Tetrachloroethane, 1,1,1-Trichloroethane, Tetrachloroethylene, Tetrachloromethane, Tetrahydrofurane, tert-Butanol, Toluene, Trichloroethylene, Water, Xylene, and mixtures thereof.

The solvent can be chosen from non-polar solvents, polar aprotic solvents, or polar protic solvents. The mixture may comprise an additive (used to control the crystallization during the perovskite synthesis). The additive may further be selected from the group consisting of: hypophosphorous acid (HPA), and 1,8-diiodooctane (DIO).

Among the virtually infinite list of perovskite forming solutions that can be deposited by the method described herein, the following can be cited: CH3NH3PbX3, Csx(CH3(NH2)2)1-xPbX3, Csx((CH3NH3)x(CH3(NH2)2)1-x)

(100-x)PbX3, AxCsy((CH3NH3)z(CH3(NH2)2)1-z)1-yPbX3 where A is an alkali metal (Li, Na, K, Rb), suitable for the preparation of photoactive layer; BaTiO3, PbTiO3, CaTiO3, SrTiO3, PbZrO3, SrTiO3, KTaO3, KNbO3, NaNbO3, Pb(Mg1/3Nb2/3)O3, Pb(Zn1/3Nb2/3)O3, Pb(Mn1/3Sb2/3)O3, Pb(Co1/3Nb2/3)O3, Pb(Mn1/3Nb2/3)O3, Pb(Ni1/3Nb2/3)O3, Pb(Sb1/2Sn1/2)O3, Pb(Co1/2W1/2)O3, Pb(Mg1/2W1/2)O3, LiNbO3, LiTaO3, BiTiO3, NaTiO3, NaNbO3, KNbO3, for the growth of ferroelectric and piezoelectric material; La1-xSrxMnO3, La2NiO4, La2CoO4, GdBaCo2O5, PrBaCo2O5, NdBa1-xSrxCoO2O5, Ba1-xSrxCo1-yFeyO3, for the elaboration of fuel cells; BiCr1-xGaxO3, for magnetic materials; NaNbO3, KNbO3, LaFeO3, LaCoxFe1-xO3, La1-xSrxCoO3, LaSrNiO4, LaxSrx-1FeyBiy-1O3, La2NiO4, La2-xSrxCuO4, LaSrNi1-xAlxO4, LaMnO3, LaFeO3, LaCoO3, LaTi1-xCuxO3, LiTaO3, NaTaO3, KTaO3, CaTa2O6, SrTa2O6, BaTa2O6, for catalysis; La-based perovskite-type oxides (La1-xSrxCoO3, Pr1-xSrxCoO3, Sm1-xSrxCoO3, Gd1-xSrxCoO3, Tb1-xSrxCoO3, LaCoO3, La1-xSrxMnO3, LaCo1-xNixO3), for electronic conductions. The skilled person will be able to choose the perovskite forming material as required by a specific application.

Plasma process: Power preferably between 0.01 W/cm2 and 1,000 W/cm2. Excitation frequency Radio-frequency (RF) (1 MHz<f<1 GHz), low-frequency (LF) (<1 MHz), very high frequency (VHF) (30 MHz<f<300 MHz). Preferably, the process gas may comprise at least one gas selected from the group consisting of: air, argon, carbon dioxide, helium, hydrogen, nitrogen, oxygen, and xenon. The plasma process may comprise an oxidizing agent. The oxidizing agent may further preferably be selected from the group consisting of: bromine, bromide compounds, chlorine, chloride compounds, chlorite compounds, chlorate compounds, chromate compounds, chromic acid, dichromic acid, dichromate compound, perchlorate compounds, fluorine, fluoride compounds, hexavalent chromium compounds, hydrogen peroxide, hypochlorite compounds, hypohalite compounds, inorganic peroxides, iodine, iodide compounds, nitrate compounds, nitric acid, nitrous oxide, osmium tetroxide, oxygen, ozone, peroxydisulfuric acid, peroxymonosulfuric acid, potassium nitrate, silver oxide, sodium perborate, sulfuric acid and water.

The duty cycle (DC) is defined as tON/(tON+tOFF) where tON is the time the plasma is ON, and tOFF is the time the plasma is OFF. The duty cycle of a plasma pulse is preferably higher than 0.1%. Each plasma discharge is generated by a voltage pulse, which rises to the plasma discharge breakdown voltage in one nanosecond to one millisecond. The duration of the voltage pulse is preferably between one nanosecond and one second.

The plasma head can be stationary or it can have a velocity for 1D, 2D, or 3D motion between 1 μm/s and 1 m/s. The substrate rotation rate is preferably between 10 rpm and 10000 rpm. One or more scans can be used.

The surface portion of the substrate that is contacted with the perovskite mixture may preferably comprise an insulating, semiconducting or conducting material. The substrate may for example be glass, plastic, composite materials and metals. In particular, the substrate may have a planar or a three-dimensional geometry.

The height of the plasma discharge from the substrate is preferably 50 cm or less.

The method for forming a perovskite layer on a substrate can be conducted using any kind of atmospheric pressure plasma discharges, including, but not limited to: arc discharges, dielectric barrier discharges, corona discharges, radio-frequency capacitive discharges, microwave discharges, and inductive discharges. The discharge is initiated between a minimum of two electrodes where one of the electrodes may be the substrate to be coated. The electrode configuration can be planar or cylindrical. FIG. 1 shows a schematic view of an exemplary and non-limiting embodiment of a remote discharge device for implementing the method on 3D substrates in accordance with the invention.

Figure 2B:
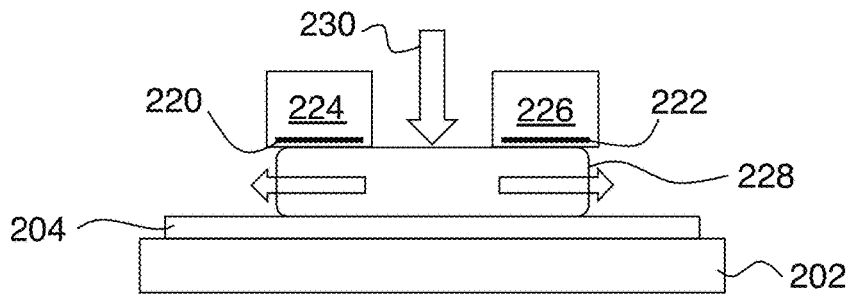

FIGS. 2A-B show schematic views of exemplary and non-limiting embodiments of a device for implementing the method in accordance with the invention. FIG. 2A shows a lateral injection dielectric barrier discharge (DBD). In this example, an optional dielectric can be inserted between stage 202 and substrate 204. FIG. 2B shows central injection DBD (here plane metallic electrodes are represented). In all configurations, the perovskite forming material can be directly exposed to the plasma discharge or to the plasma discharge afterglow region or to the plasma jet region.

The atomizing nozzle parameters can be adapted depending on the solution that is used, the deposition rate that is needed, and the surface area that need to be coated. The ultrasonic nozzle can vibrate at frequencies typically in excess of 20 kHz. The nozzle power controls the amplitude at which the atomizing surface of the nozzle vibrates and ranges from 0.1 to 10 Watts. Liquid flow rate is preferably between 1 μL/min to 10 mL/min. The height of the spray head from substrate is preferably below 50 cm.

This approach has several significant features. It is the first time the energy of an atmospheric pressure plasma discharge is used to promote the formation of perovskite films. The high energy density of the plasma discharge enables the film to be cured at high processing speeds, for example at a rate of 1 $cm^2/s$. There is at least one order of magnitude difference between conventional curing time and the method presented here due to the highly efficient removal of solvent and subsequent crystallization of the perovskite layer. Furthermore, photoactive perovskite films have been grown in ambient air via one-step deposition (not inert environment) with a relative humidity ranging from ca. 40 to 50%. Such humid conditions are generally known to be detrimental to the photoactivity of perovskite films synthesized by other means, and other work depositing perovskite in high relative humidity uses a slower, two-step coating method. Additionally, perovskites formed by the described method exhibit superior cohesive fracture properties. These enhanced mechanical properties are derived from some degree of polycrystallinity present in the film's microstructure. This work represents a significant advancement towards large scale production of perovskite based photovoltaics, demonstrating novelty. To the best of the inventors' knowledge, there has so far been no scientific evidence showing that atmospheric plasma discharges can induce the formation of perovskite layers.

Deposition of perovskite films is enabled in ambient air and at atmospheric pressure in one step. Deposition of perovskite films on a large-scale area enables high volume production. The method uses an atmospheric plasma system that can easily be adopted and adapted on a roll-to-roll or sheet coating processes. Ultrafast deposition of perovskite film enables high volume production. Low amount of material used contributes to improved chemical remediation.

B) Experimental Demonstration

B1) Introduction

Organic-inorganic metal halide perovskites have seen a resurgence in interest due to gains in power conversion efficiency (PCE). Perovskite solar cells (PSC), however, suffer from several stability challenges including thermomechanical reliability and moisture sensitivity, which are not competitive with the stability of c-Si modules and their 25 year-service lifetimes. With respect to fabrication, which represents a major advantage for solution processed PSCs, slot die coating and ambient spray coating have emerged as scalable processes, but like spin-coating, these methods require lengthy anneal times. Further works reported the use of a solvent- and vacuum-free process to produce a 12.1% PCE perovskite solar module, however, the approach requires several steps, including a cumbersome peel process which risks mechanical damage to the fragile absorber layer.

In light of these challenges, we have developed an open air Rapid Spray Plasma Processing (RSPP) method for the rapid deposition of both efficient and mechanically robust perovskite layers. $CH_3NH_3PbI_3$ ($MAPbI_3$) films were sprayed and immediately exposed to a plasma at an ultrafast linear processing rate of >4 cm/s to form efficient metal halide perovskite in open air, making it extremely amenable to roll-to-roll manufacturing. The combination of reactive species (ions, radicals, metastables, and photons) and convective thermal energy produced by the plasma rapidly transfer energy to the perovskite-precursor solvate. No additional annealing or post-deposition processing is required. Furthermore, RSPP has a high conversion yield (only 1 $\mu L/cm^2$ of solution required) in contrast to spin coating (up to 50 $\mu L/cm^2$ necessary).

Based on an inverted device architecture, we demonstrate a 15.7% PCE with an improved $V_{OC}$ due to reduced defect concentration, outperforming the spin-coating devices produced with the same composition and architecture. A tenfold increase in perovskite fracture resistance (~4.4 J m$^{-2}$) compared to spin-coated films (~0.4 J·m$^{-2}$) was also shown and is attributed to the polycrystalline grain structure of the film.

B2) Processing of $MAPbI_3$

The RSPP system, including an atmospheric plasma post-discharge and ultrasonic spray nozzle, is shown in FIG. 1, and is described in greater detail above. After spraying of the perovskite-forming solution, the plasma post-discharge was immediately scanned over the sprayed mixture to form the perovskite at rates of up to 4 cm/s, allowing substrates as large as 930 cm$^2$ to be rapidly deposited (e.g., 930 cm$^2$ area deposited in less than 4 minutes) with high quality perovskite films. Clean, dry air was used as the plasma gas, promoting a cost-effective plasma process.

Optimized conditions were found by adjusting the scan rate of the system, the spray solution concentration and liquid flow rate, and the plasma curing dose including plasma power, gas flow rate and plasma nozzle-substrate distance a.

The stoichiometry and chemical composition of the films were determined by X-ray photoelectron spectroscopy (XPS, FIGS. 9A-C and 10A-D). Extended Data Table 1 displays the relative atomic concentration of the different elements related to FIG. 10A. All the films produced from the different conditions contained carbon, nitrogen, lead and iodine, in good agreement with the formation of $MAPbI_3$ films.

Figure 3:
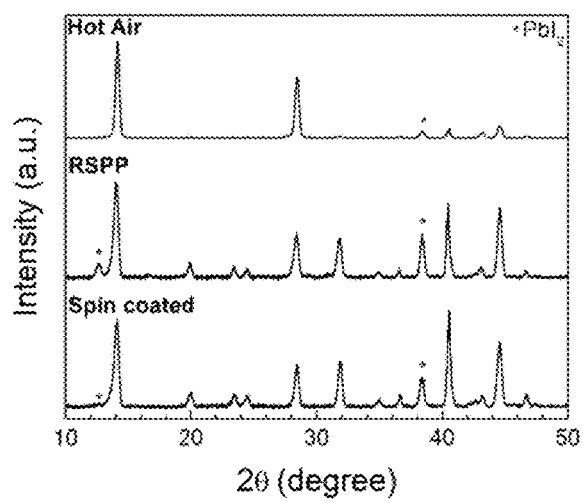
FIG. 3 shows X-ray diffraction results pertaining to the experiment of section B.

FIG. 3 shows X-ray diffraction pattern of the perovskite films deposited by spin coating, RSPP and hot air curing. Intense peaks observed in X-ray diffraction (XRD) at 14.10°, 28.44°, 31.83° and 40.53° correspond to (110), (220), (310) and (224) planes of the tetragonal phase of $MAPbI_3$, respectively. The reactive species from the plasma were not detrimental to the formation of the $MAPbI_3$ layer and, in fact, produced fully cured and pinhole-free films. The presence of lead iodide ($PbI_2$) is apparent in both the RSPP and spin-coated films from the (100) and (300) peaks at 2θ=12.70° and 38.40°, respectively.

Figure 4:
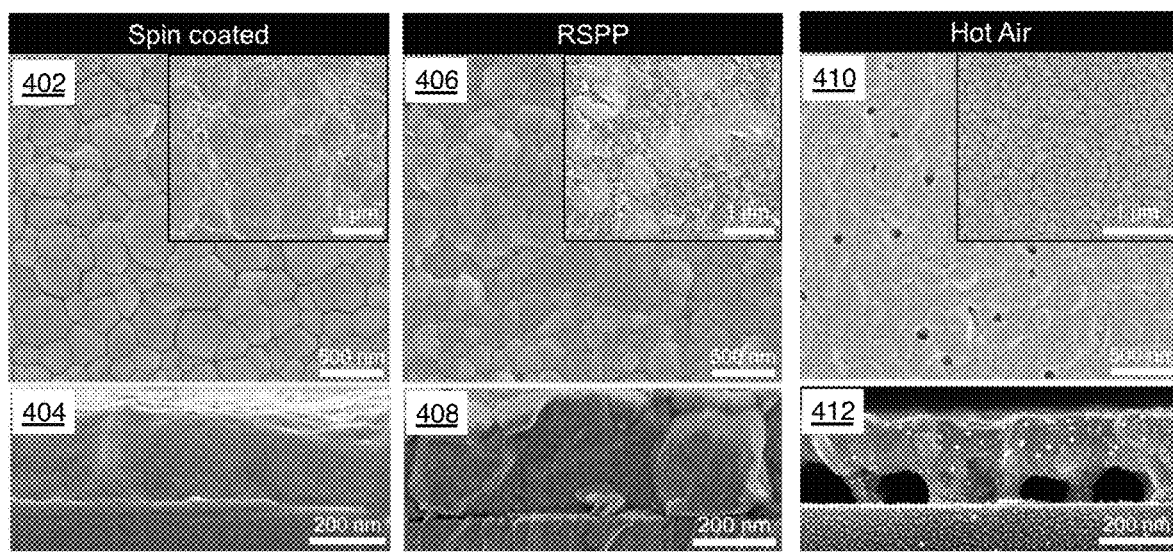
FIG. 4 shows SEM images pertaining to the experiment of section B.

FIG. 4 shows SEM (scanning electron microscope) top views and SEM cross-sectional images of the perovskite thin films. Here 402 and 404 are top and cross section images, respectively, of a spin coated perovskite film. Similarly, 406 and 408 are top and cross section images, respectively, of an RSPP perovskite film. Finally, 410 and 412 are top and cross section images, respectively, of a hot-air cured perovskite film.

Spin-coated film grain diameters ranged from ca. 100 nm to 500 nm (402, 404 on FIG. 4), similar to previously reported results using the same perovskite precursors. In some cases, grain diameters up to 1 μm were observed (402 on FIG. 4, inset). RSPP films exhibited a polycrystalline grain structure, apparent in top-down (406 on FIG. 4) and cross-sections (408 on FIG. 4). Two distinctive grain sizes were observed in the RSPP films: a smaller distribution of grain sizes similar to the spin-coated controls (402, 404 on FIG. 4) with a slightly smaller average grain size (100-300 nm) and a second distribution of micrometer-sized anisotropic platelets (406 on FIG. 4, inset). These features are unusual compared to a standard spin-coated film, where individual, block-like grains comprise the entire film thickness. The grain boundaries of the RSPP film did not exhibit any voids that would result in carrier recombination or shunt pathways in a device. The high density of grains and bimodal grain size distribution in RSPP likely arises from the unique synergy between the plasma reactive species and the thermal energy convected by the background gas.

To discriminate the role of the plasma reactive species (ions, radicals, metastables, and photons) and thermal energy in the formation of the perovskite, hot air at the same temperature as the plasma was used to cure the perovskite-forming solution. The uniform surface coverage observed in the RSPP film was in stark contrast to the hot air-cured film, which resulted in poor morphology and pinholes of several hundreds of nanometers in diameter (410 on FIG. 4). Cross-sections (412 on FIG. 4) revealed large voids present at the interface of the substrate and the $MAPbI_3$ layer that would render a PSC completely inoperable. These results strongly suggest that plasma reactive species contributed to the formation of a uniform perovskite film as discussed below.

B3) Anneal and Growth Mechanisms

B3.1) Plasma Reactive Species and Convective Energy

The plasma energy involves synergistic contributions from reactive species (ions, radicals, metastables, and photons) and convective thermal energy. Both in-situ spectroscopy and thermal measurements were used to determine the extent to which these contribute to perovskite formation. FIGS. 5A-I show these results.

Figure 5E:
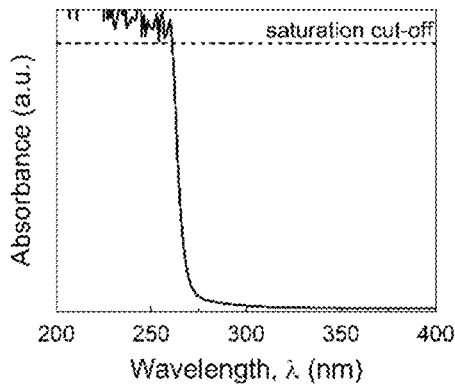
Figure 5F:
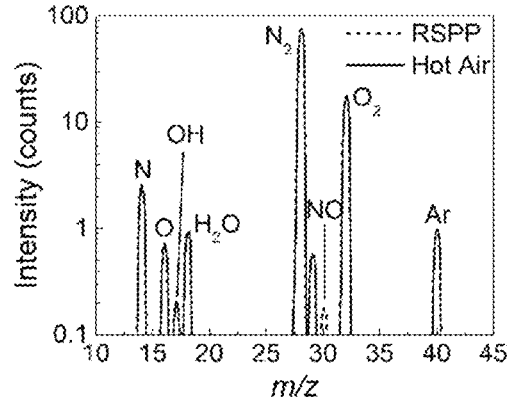
Figure 5G:
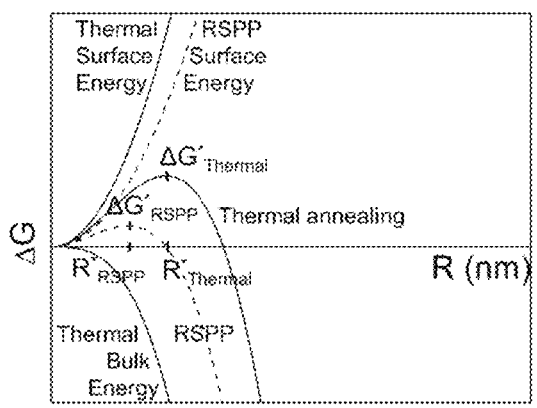
Figure 5H:
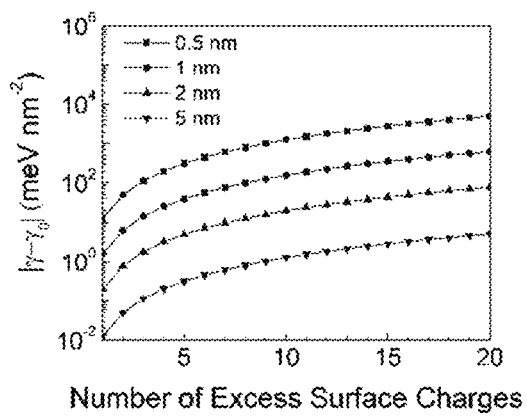
Figure 5I:
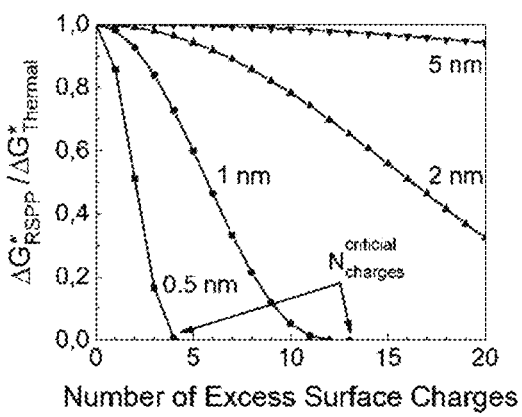

More specifically, FIG. 5A shows time-resolved in-situ gas phase mass spectra of elements of interest present during RSPP anneal. FIGS. 5B-C show the optical emission spectroscopy spectrum for atmospheric pressure air plasma post-discharge in the UV range (FIG. 5B) and in the visible range (FIG. 5C). FIG. 5D shows time-resolved temperature measurement of the plasma post-discharge during RSPP. FIG. 5E shows absorption spectrum of DMF. FIG. 5F shows in-situ gas phase mass spectra corresponding to the gas phase of RSPP air plasma post-discharge and hot air in mass range m/z=10-45, showing the presence of NO. radicals only in the RSPP gas phase. FIG. 5G shows diagrams representing the nucleation of perovskite for different annealing energy. FIG. 5H shows change in surface energy due to the number of excess charged species for different nuclei radius. FIG. 5I shows influence of charged species on the activation barrier to nucleation of perovskite for different particle radius. The critical number of charged species ($N_{charges}^{critical}$) represents the number of excess charges needed to overcome the activation energy.

Free radical and excited metastable species, such as nitric oxide (NO), atomic nitrogen (N), and atomic oxygen (O) (FIGS. 5B, 5C, 5F, as determined from optical emission and mass spectrometry), each carry a significant amount of energy (>1 eV), which can dissociate and volatilize solvent molecules. Photons provide another source of energy (FIG. 5B), generated by radiative de-excitation from the atomic and molecular radicals, and metastable species. The thermal energy is defined by the background gas temperature, i.e. the temperature of the electrically neutral species within the plasma. This energy is transferred to the precursor-solvate through convection as shown by the large Rayleigh number (~$10^6$, Extended Data Eq. (1)).

The plasma passed over the sample for a total exposure of 250 ms, during which time, the temperature rose rapidly to 152° C. (FIG. 5D). The flux of these reactive species rapidly increased during the plasma exposure. As the plasma post-discharge moved away from the sample, the density of reactive species dropped abruptly and the film was cooled to room temperature (FIG. 5D).

We next elucidate how the combination of reactive species (ions, radicals, metastables, and photons) and thermal energy affect the steps that govern the nucleation and growth of the perovskite during RSPP.

B3.2) Solvent Evaporation and Supersaturation

The plasma anneal lead to superheating and rapid removal of the solvent. When sampling the volatilized compounds during RSPP, in-situ gas phase mass spectrometry (GPMS) detected the rapid evolution of DMF, acetate, and methyl amine (FIG. 5A). From the evolved gas analysis, it was apparent that the acetate dissociated from the salt and was volatilized during the cure. The evolution of methylamine from the solution was expected, as there was a molar excess of methylammonium iodide (MAI) in solution based on previously optimized methods.

Radicals that involve reactive oxygen and nitrogen species (RONS) are known to play a key role during plasma-liquid interactions. In-situ gas-phase mass spectrometry (GPMS) revealed the presence of N., O., NO. and .OH radicals at the substrate in the case of RSPP (FIG. 5F). Free radicals produced by the plasma were convectively transported to the sprayed liquid by the gas flow and forced convection enhanced the mass transfer of the radicals through the perovskite precursor-solvate. Models showed that RONS may penetrate a liquid and react to a depth from 10 to 100 μm. Given the thin nature of these wet precursor films (~1 μm), the radical species would have access to the entire depth of the film, diffusing through the plasma-liquid interface, inducing the dissociation of solvent molecules into smaller compounds and their subsequent evaporation (FIG. 5A).

The system can gain additional thermal energy if the optical emission of the plasma aligns well with the absorption spectrum of the solvent. The NOγ system emitted by the air plasma produces deep UV photons (200<λ<300 nm), which coincided with the absorption peak of DMF (FIG. 5E). When UV light is absorbed by DMF, excited electrons are quickly quenched and the optoelectronic energy is transferred to thermal energy.

The synergistic effect of these mechanisms resulted in rapid and efficient removal of solvent and acetate molecules. As the system undergoes supersaturation, the precursor-solvate contracts and concentrates, in an analogous manner to spin-coating. During and following supersaturation, perovskite crystallites begin to nucleate and grow.

B3.3) Nucleation and Grain Growth

Here, we consider how the combination of reactive species (ions, radicals, metastables, and photons) and thermal energy can promote the nucleation and growth of the perovskite film during RSPP.

It has recently been reported that illumination can enhance the rate of perovskite formation by lowering the surface energy between the growing crystallite and the precursor-solvate. This phenomenon is a derivative of electrowetting—aptly named photo-electrowetting (PEW)—observed at an electrolyte/semiconductor interface, and is reported for other photovoltaic materials like silicon. Incident light above the semiconductor's bandgap generates free carriers, which modifies the system's electric potential. The addition of electrical energy modifies the surface energy according to the Lippmann equation (Eq. (1)):

$$\gamma - \gamma_0 = -\frac{1}{2} \cdot \frac{1}{A} \cdot \frac{Q^2}{C_0} \qquad (1)$$

where γ is the surface energy in the presence of charge, $\gamma_0$ is the uncharged surface energy, Q is the excess charge at the surface of the semiconductor, A is the surface area, and $C_0$ is the capacitance of the structure. The change in surface energy depends on the square of the excess surface charge. An interesting consequence of this quadratic dependence is the contribution of both positive and negative excess surface charge, meaning that any charged species can contribute to the change in surface energy. In the case of RSPP, not only photo-generated carriers can contribute as recently reported, but reactive species (ions, radicals, metastables and photons) can participate through diffusion but also reactions with the liquid, generating additional charged species. The photon flux under an AM1.5G solar spectrum for photon energy ≥1.5 eV can be estimated to be ~$10^{21}$ photons·$s^{-1}$·$m^{-2}$ at most, without considering any potential loss of photon density from reflection, scattering, and absorption. In the case of RSPP, not only photon flux can generate charged carriers, but reactive species from the plasma with high electron and ion density (i.e. $10^{18}$-$10^{19}$ $m^{-3}$ each), radical density (i.e. $10^{21}$-$10^{23}$ $m^{-3}$·s), and metastables density (≥$10^{10}$ $m^{-3}$), make RSPP more effective to introduce charged species than photon flux only, further lowering the activation energy of grain nucleation and enhancing the rate of perovskite nucleation and growth. The change in surface energy is dependent on the number of excess charge and is all the more pronounced as the particle radius is small (FIG. 5H).

According to classical homogenous nucleation theory, the free energy of a growing particle is given by Extended Data Eq. (4) and a particle is considered stable when R>R*, where R* is the critical radius associated with ΔG*, the energy barrier to nucleation (Extended Data Eq. (5)). Combining Eq. (1) and Extended Data Eq. (5), we arrive at Eq. (2) for the nucleation barrier associated with plasma annealing:

$$\Delta G^*_{RSPP} = \frac{16\pi}{3g_v^2}\left(\gamma_0 - \frac{1}{2} \cdot \frac{1}{A} \cdot \frac{Q^2}{C_0}\right)^3 \qquad (2)$$

FIG. 5I represents the ratio of the activation barrier of the charged surface ($\Delta G_{RSPP}^*$) to the uncharged surface ($\Delta G_{Thermal}$*) as a function of the number of excess surface charges. For small nuclei (r<1 nm), even a few excess surface charges can significantly lower the activation barrier. The effect is less pronounced for larger particles (r≥5 nm), as the bulk Gibbs free energy begins to dominate over any change in surface energy arising from charging. These numbers suggest that very small quantities of excess surface charge can significantly decrease the nucleation barrier, reduce the critical radius, and increase the number of stable nuclei.

Mass spectrometry and optical emission spectroscopy indicated a significant amount of radicals, metastables, and photons emitted by the plasma. The plasma generated reactive species created excess charge at the surface of the semiconductor particle, lowering the surface energy and stabilizing small nuclei against dissolution. This is evinced by the high density of grains observed both in the plane of the film, as well as through the thickness (406 on FIG. 4).

The large, irregular grains observed in SEM (406 on FIG. 4, inset) arose from subsequent Ostwald ripening (OR), a process that describes the growth of large particles at the expense of small particles as the film undergoes cooling. For example, small quantities of precursor solvate may remain in the grain boundaries of the perovskite following the plasma exposure. As the sample cools, it becomes less favorable for new particles to nucleate. Instead, the precursor-solvate is consumed by larger grains, which have more favorable kinetics. This can result in grain coalescence, and the stitching together of many small grains into one, larger grain. These large grains are scattered throughout the film, apparent in top-down SEM (406 on FIG. 4, inset).

B4) Mechanical Properties

The fracture energies ($G_c$) of the MAPbI$_3$ perovskite thin films are known to be extremely low ($G_c$ values typically <1.5 J·m$^{-2}$). From decades of research in microelectronic devices, most standard processes in the semiconductor industry require $G_c$ in excess of 5 J·m$^{-2}$ in order to withstand device manufacturing and maintain product longevity, which highlights a real concern over the mechanical reliability of these perovskite systems. Given the quick ascent to efficiencies comparable to c-Si cells, it stands that the most important challenge for the scaling of PSC will be in their thermomechanical reliability and degradation.

Figure 6A:
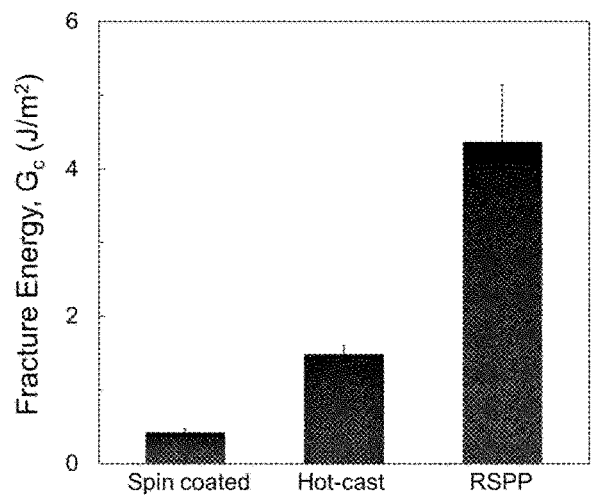
FIGS. 6A-C show fracture results pertaining to the experiment of section B.
Figure 6B:
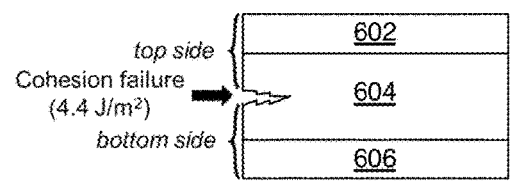
Figure 6C:
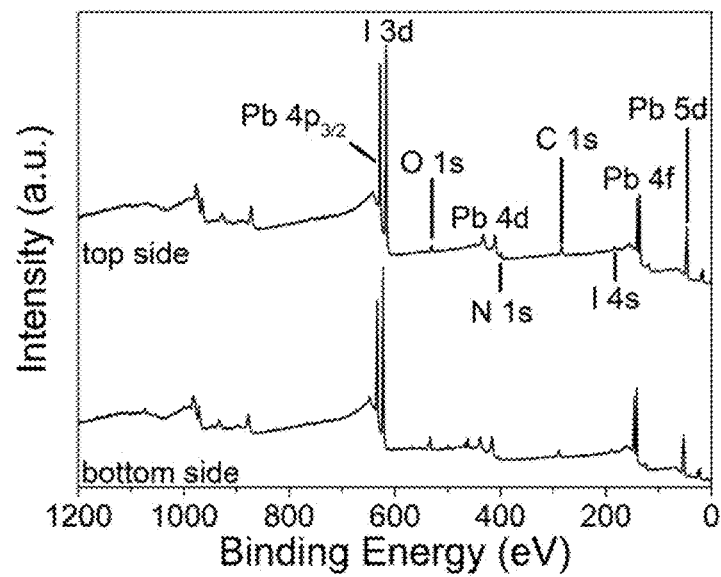

FIG. 6A shows fracture energy results for spin coated, hot-cast and RSPP perovskite films. FIG. 6B shows architecture of the tested samples showing the cohesion failure within the MAPbI$_3$ perovskite layer. Here 602 and 606 are substrates and 604 is the MAPbI$_3$ perovskite layer. FIG. 6C shows XPS survey spectra of the fracture halves of the RSPP specimen after delamination.

The $G_c$ of the RSPP perovskite was compared to a spin-coated film and to a hot-cast film (FIG. 6A), the latter being the most robust planar perovskite reported to date. The fracture energies of the prepared cells were determined using the double-cantilever beam (DCB) test. XPS analysis of the fracture surfaces revealed that the failure occurred cohesively within the perovskite layer (FIGS. 6B, 6C). The $G_c$ values ranged from 0.43 J·m$^{-2}$ for the spin-coated perovskite to 4.4 J·m$^{-2}$ for the RSPP film (FIG. 6A), which is a 10-fold increase and the highest fracture toughness ever reported for an organic-inorganic perovskite film without a mechanically reinforcing scaffold.

The remarkable fracture resistance of RSPP perovskite can be explained by its unique morphology (408 on FIG. 4). The rapid curing induced a polycrystalline structure in the perovskite film, where crystallites may interlock more effectively. The random orientation and range of grain sizes resulted in a tortuous fracture path, driving up the energy needed to propagate the crack.

B5) Solar Cell Device

Figure 7A:
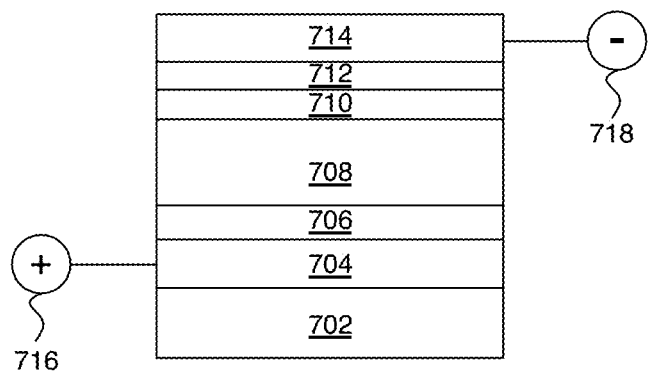
FIGS. 7A-7I show solar cell results pertaining to the experiment of section B.
Figure 7B:
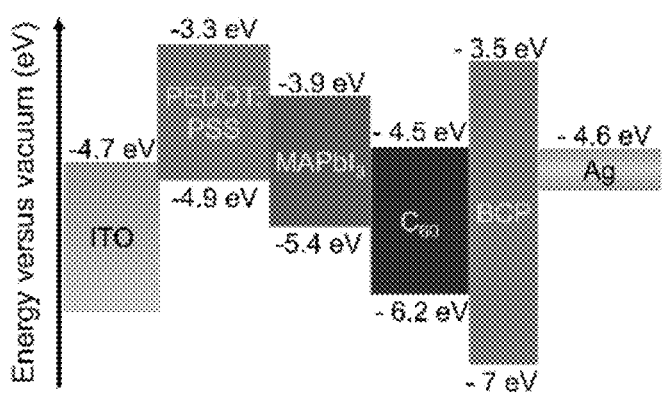
Figures 7C, 7D:
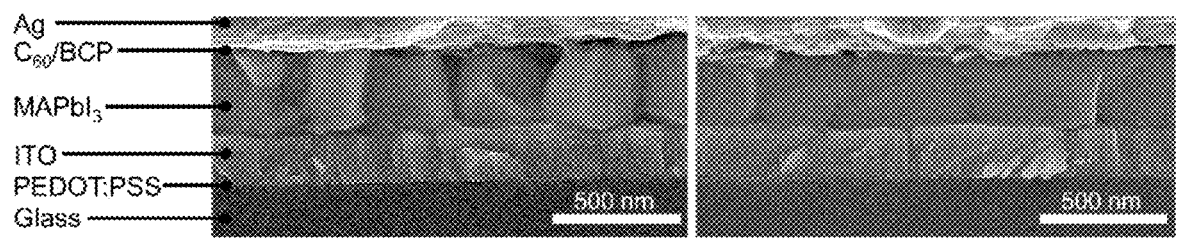
Figure 7E:
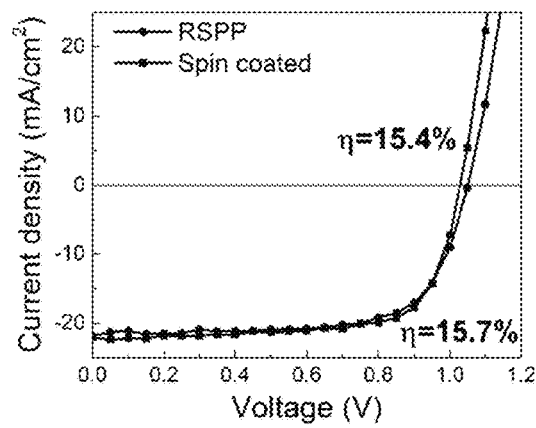
Figure 7F:
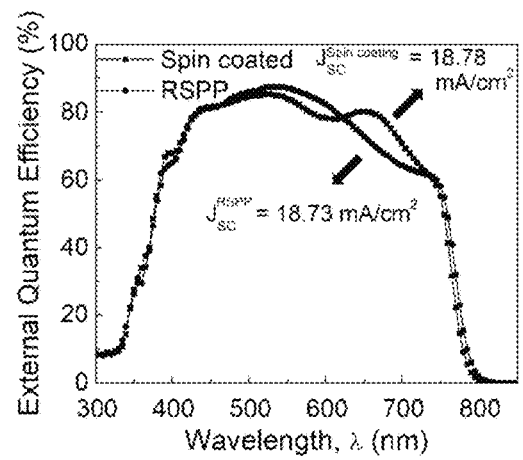
Figure 7G:
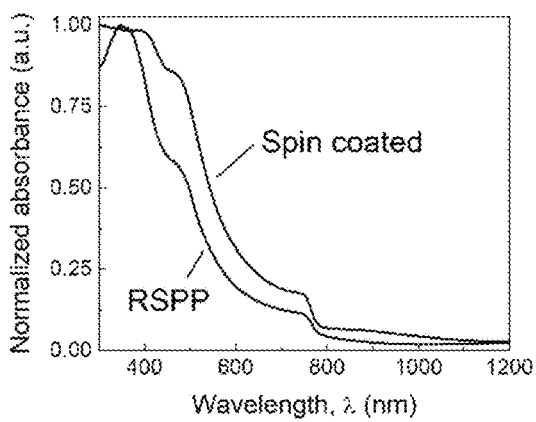
Figure 7H:
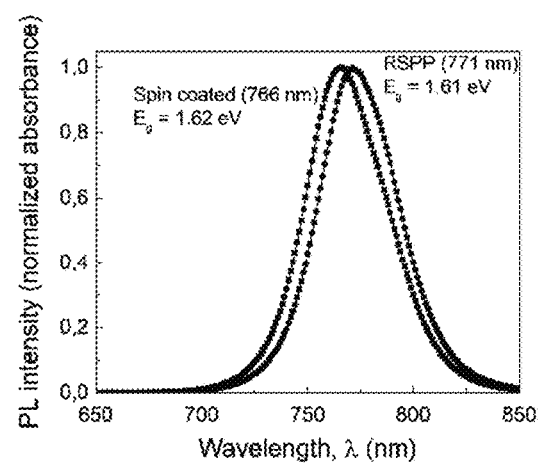
Figure 7I:
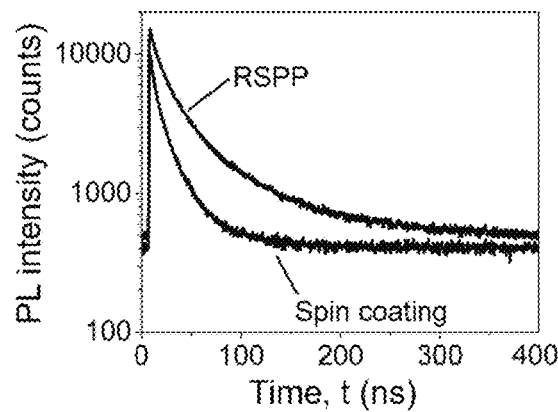

FIGS. 7A-7I show solar cell device performance and optical properties. FIG. 7A is a schematic illustration of the planar perovskite solar cell architecture used in this study. Here 702 is glass, 704 is ITO (indium tin oxide), 706 is PEDOT:PSS (Poly(3,4-ethylenedioxythiophene)-poly(styrenesulfonate)), 708 is MAPbI$_3$, 710 is C$_{60}$, 712 is BCP (bathocuproine) and 714 is Ag. Terminals 716 and 718 are as shown. FIG. 7B is an energy-level diagram corresponding to the valence and conduction band of the different layers of materials included in the solar cell devices. FIGS. 7C and 7D are cross-sectional SEM images of complete solar cells elaborated from RSPP (FIG. 7C) and spin-coated (FIG. 7D) perovskite film. FIG. 7E is a current-density/voltage curve of the best-performing RSPP planar heterojunction perovskite solar cell measured under simulated AM1.5 sunlight of 1000 mW·cm$^{-2}$ irradiance. FIG. 7F shows EQE (external quantum efficiency) plots of the spin-coated and RSPP MAPbI3 films. FIG. 7G shows absorption spectra of the spin-coated and RSPP MAPbI$_3$ films. FIG. 7H shows time-integrated PL spectra and FIG. 7I shows time-resolved PL decay transients measured at 765±10 nm for the spin-coated film and at 770±10 nm for the RSPP film.

Figure 8:
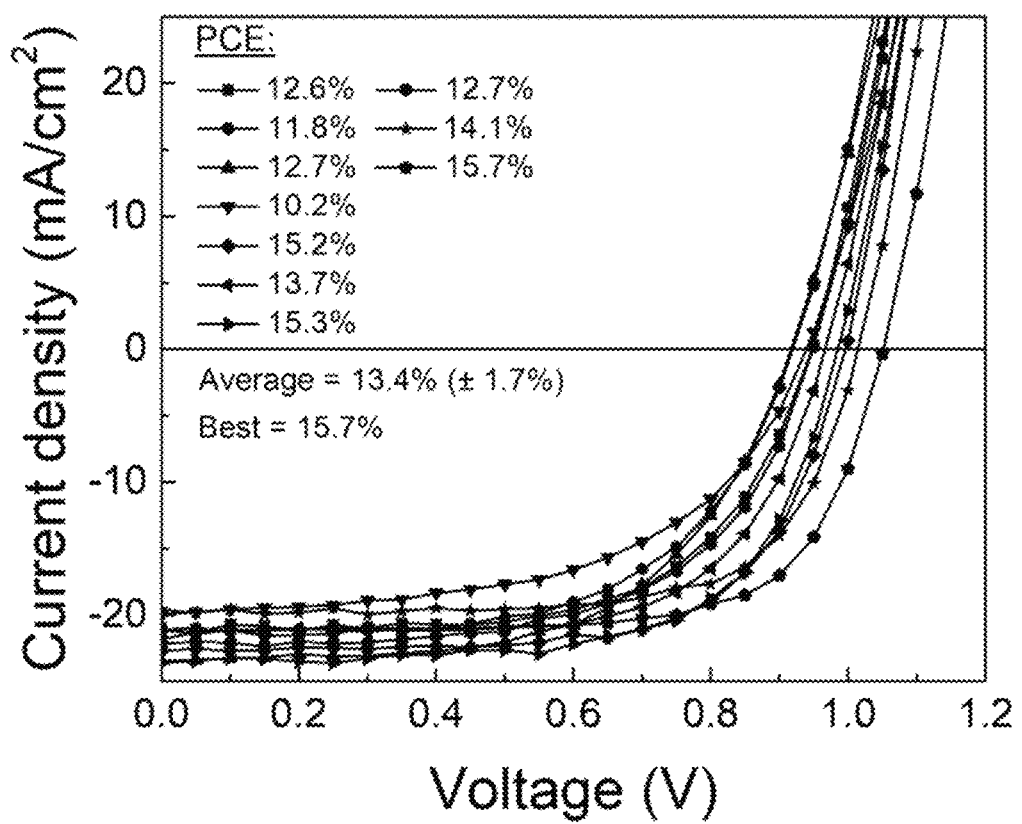
FIG. 8 shows further solar cell results pertaining to the experiment of section B.

FIG. 8 shows J-V curves associated with the completed devices produced from 10 samples of glass/ITO/PEDOT: PSS substrates coated with MAPbI$_3$ by RSPP in air in 7 seconds.

B5.1) Efficiency and Optical Properties

The photoactive quality of RSPP MAPbI$_3$ was assessed in a solar cell device and compared to a spin-coated control. The device was constructed based on an inverted PSC architecture (FIG. 7A).

Figure 11A:
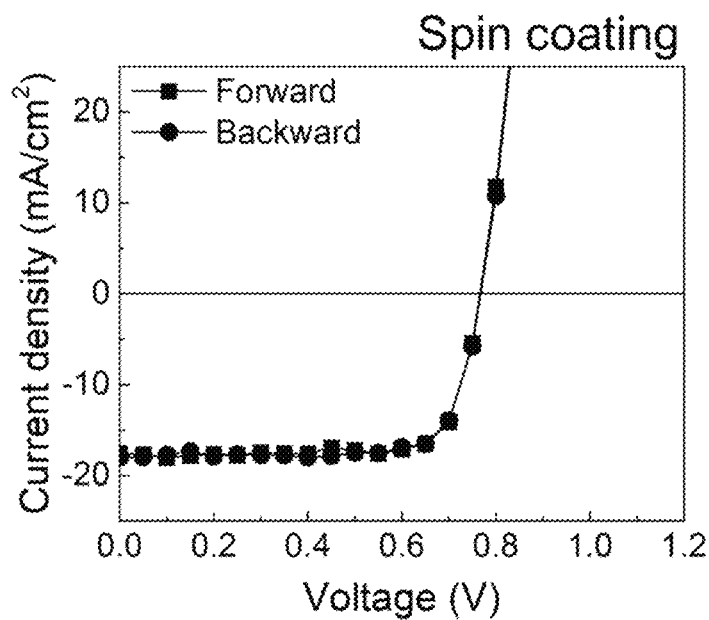
FIGS. 11A-B show hysteresis measurements relating to the experiment of section B.
Figure 11B:
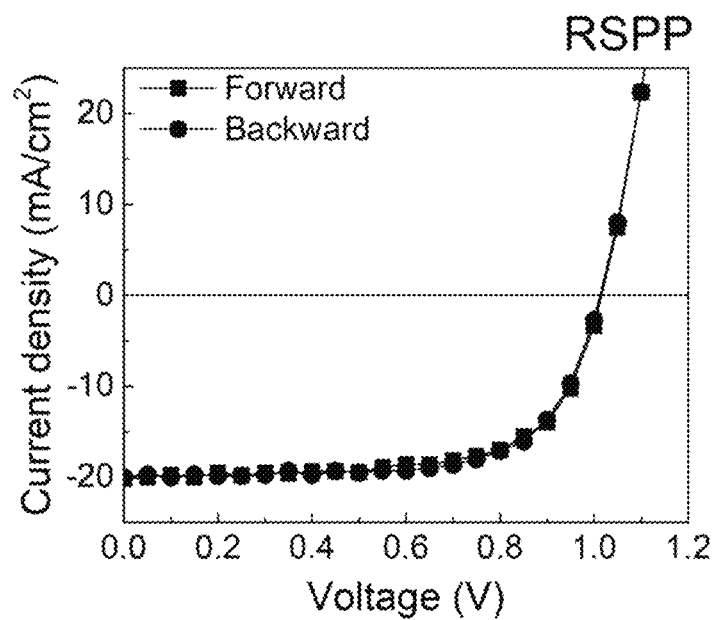

Spin-coated MAPbI$_3$ films were deposited by using an optimized solution for this process. The RSPP devices exhibited a best PCE of 15.7% (FIG. 7E) as well as remarkably consistent performances, averaging 13.4% across the batch with a standard deviation of 1.7% (FIG. 8, Extended Data Table 2). This reproducibility was comparable to the spin-coated devices (Extended Data Table 2). Both devices prepared from RSPP or spin-coated perovskite presented a hysteresis-free behavior (FIGS. 11A-B).

Figures 12A, 12B:
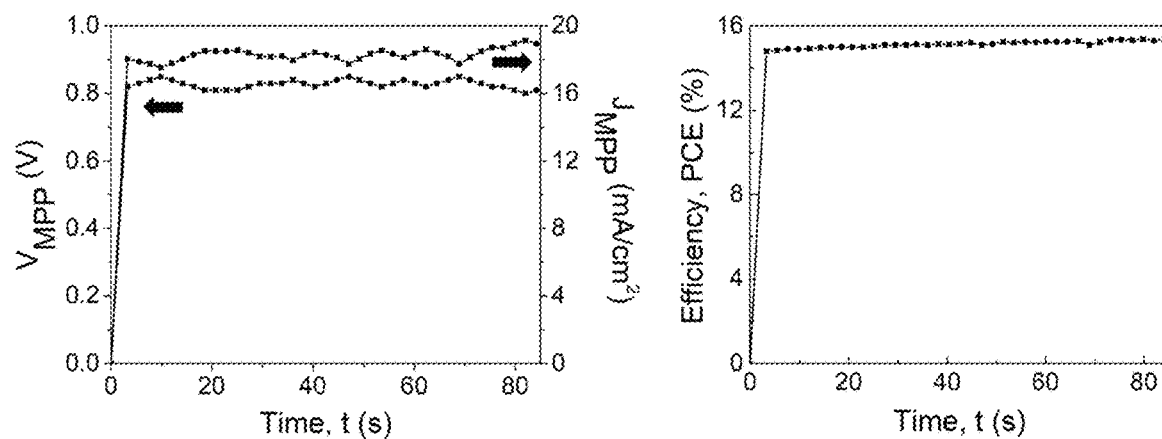
FIGS. 12A-B show stability measurements relating to the experiment of section B.

The best-performing RSPP device exhibited a fill factor (FF) of 0.69, a short-circuit photocurrent density ($J_{SC}$) and open-circuit voltage ($V_{OC}$) of 21.8 mA/cm$^2$ and 1.05 V, respectively. Photocurrent density and voltage were stable at maximum power point, and maximum power point tracking showed a good stability over time (FIGS. 12A-B). It is known that the p-i-n inverted structure based on PEDOT: PSS as HTL entails a significant $V_{OC}$ drop of several hundreds of millivolts compared to other materials such as PTAA and NiO. However, RSPP achieved an outstanding gain in $V_{OC}$ of 70 mV compared to the spin-coated control, attaining 1.05 V, among the highest $V_{OC}$ ever measured with PEDOT:PSS as a hole-transporting layer. This increase in $V_{OC}$ was consistent across all RSPP devices (Extended Data Table 2) and was associated with differences in the perovskite quality.

FIG. 7G shows the absorption spectra of MAPbI$_3$ synthesized from spin-coated and RSPP, both of which exhibited the same absorption features. Steady-state photoluminescence (PL, FIG. 7H) measured a slightly lower band gap for RSPP MAPbI$_3$ (1.61 eV) than for its spin-coated counterpart (1.62 eV). The corresponding external quantum efficiency (EQE, FIG. 7F) were also very similar between both films. EQE had a broad plateau with a maximum value of 85% for spin coating and 87% for RSPP over essentially the entire visible range. The integrated $J_{SC}$ values calculated from EQE (18.78 mA/cm$^2$ for spin coating and 18.73 mA/cm$^2$ for RSPP) matched well with the measured values from the J-V curve. A pronounced shoulder around 700 nm can be observed due to reflection phenomena occurring from the PEDOT:PSS layer.

FIG. 7I shows the time-resolved PL spectra of the spin-coated and RSPP MAPbI$_3$ films. The PL decay of the films indicated a higher carrier lifetime for the RSPP MAPbI$_3$ than for the spin-coated perovskite. $V_{OC}$ is dependent on both $J_{SC}$ and diffusion length ($L_{diff}$) (Extended Data Eq. (7) and (8)). The current density $J_{SC}$ was relatively close between the two films, therefore, the diffusion length may explain the higher $V_{OC}$ obtained with RSPP. Trap states introduced by defects can cause carrier recombination, creating efficient recombination pathways, negatively impacting the diffusion length. One explanation is the interaction with plasma reactive species resulted in the quenching of trap states during film deposition, leading to longer carrier lifetime and larger diffusion lengths. For example, photo-absorption or surface charging may play a role, although further experimentation will be required to identify any specific mechanism. The results suggest that RSPP perovskite had a lower defect density compared to spin-coated devices.

B5.2) Large-scale Devices

The scalability of RSPP was assessed by fabricating larger area devices. Considering the substrate area limitation we faced due to the deposition of PEDOT:PSS by spin coating, we lined up 10 regular-size substrates (2×2 cm$^2$) to simulate a large area device with a total electrode area of 2.4 cm$^2$. These substrates were coated with perovskite by RSPP. The total deposition process occurred in air in 7 seconds. FIG. 8 shows J-V curves for these 10 devices. The best device showed a 15.7% PCE as discussed previously. By averaging the electrodes area and the PCE for each of them, we obtained a PCE average of 13.4% (±1.7%) for a 2.4 cm$^2$ electrode area. We attribute the variation not to non-uniformity in the RSPP of the perovskite layer (FIG. 13), but to subsequent layers non-uniformity and/or possible damages that could have affected the samples during handling. Note that the variation in the performance parameters of RSPP is similar to the spin-coating ones (Extended Data Table 2).

B6) Conclusion

A pathway towards fast, scalable fabrication of efficient and mechanically robust perovskite films is demonstrated. Nucleation and growth relative to RSPP of perovskite is governed by superheating the perovskite precursor-solvate, photo-thermal nucleation and growth of crystallites, and ostwald ripening of grains.

Devices fabricated with RSPP obtained 15.7% PCE and a $V_{OC}$ of 1.05 V in an inverted PSC. RSPP MAPbI$_3$ showed higher carrier lifetime than for spin-coated perovskite. The favorable optoelectronic properties are attributed to a lower concentration of defects in RSPP. The plasma process resulted in one of the toughest films ever measured to date, with a significant increase in fracture resistance, a key metric for reliability. RSPP enabled rapid deposition of high-quality perovskite films on large-scale substrates with high efficiencies and low deviations. Further increases in PCE are anticipated by incorporating multiple cation species into the perovskite structure. Cesium and formamidinium, for instance, may contribute to greater thermal and moisture resistance, in addition to higher efficiencies, despite fabrication in ambient.

B7) Methods

B7.1) Materials and Solution Preparation

Methylammonium iodide (MAI) was purchased from Dyesol and used as received. Lead acetate trihydrate (PbAc$_2$·3H$_2$O, 99.999%, CAS: 6080-56-4) and hypophosphorous acid (HPA) solution (50 wt. % in water) were purchased from Sigma-Aldrich. The preparation of the perovskite solution consists in dissolving MAI and PbAc$_2$·3H$_2$O (molar ratio of 3:1) in anhydrous N,N-Dimethylformamide (DMF, anhydrous, 99.8%) at a total concentration of 35.7 wt. %. Subsequently, an HPA:DMF (1:100 volumetric ratio) solution was added in the resulted perovskite solution at a concentration of 3.7 wt. %. The solution was stirred and filtered before use.

B7.2) Perovskite Layer Deposition.

B7.2.1) Rapid Spray Plasma Process (RSPP)

RSPP perovskite films were synthesized using an atmospheric plasma deposition system provided by Plasmatreat GmbH (Hayward, Calif., USA). The atmospheric pressure plasma jet system used in this study is based on the blown-arc discharge configuration. The arc discharge is produced between two coaxial electrodes and blows out of a nozzle by the main process gas flow (air) at a flow rate of 30 standard liters per minute (slm). The high-voltage electrode was driven by a DC power supply at an excitation frequency of 21 kHz. The resulting arc current was measured to be 18.0 A. The perovskite solution was sprayed onto the substrates in ambient air using a 120 kHz ultrasonic atomizing nozzle (AccuMist, Sono-Tek Corporation) operating at 1.0 W, an atomizing gas pressure of 1 psi and fed by a syringe pump delivering 200 μL·min$^{-1}$. The mean diameter of the produced droplets was 25 μm. The deposited liquid layers were quickly (0.25 seconds) exposed to the atmospheric plasma jet system to promote the curing of the sprayed solution. The substrates were placed at a distance a=4.0 cm from the plasma nozzle. The spray nozzle-to-substrate distance (b, FIG. 1) and the plasma nozzle-to-spray nozzle distance (c, FIG. 1) were kept at a distance of 5 cm and 8 cm, respectively. The moving speed of the nozzles were kept constant at 40 mm/s and 1 pass was performed. The overall procedure was carried out in an open-air enclosure at ca. 25° C. and 40% R.H.

B7.2.2) Hot Air

Hot air-cured perovskite films were synthesized using a stainless-steel tube with an internal diameter (I.D.) identical to the one of the plasma nozzle. Air was heated to 155° C. (±5° C.) and passed through the tube at a flow rate of 30 slm to match the same temperature and flow rate that are used for the plasma. All the other parameters are the same that are used with the plasma post-discharge.

B7.2.3) Spin-coated Deposition.

Spin-coated perovskite films were synthesized from the same precursor materials and concentrations. The solution was filtered and spun at 2000 rpm for 60 s with a 2000 rpm/s ramp rate with a constant stream of dry air directed at the sample to aid solvent evaporation. The films were dried at room temperature then annealed at 100° C. for 5 min in dry air to complete the formation of the perovskite layer.

B7.3) Device Fabrication

Devices were fabricated on ITO-coated glass (Xin Yan Technology, sheet resistance 10Ω/□). Substrates were then cleaned sequentially in 1:10 Extran:DI water solution followed by sequential sonication and rinsing with DI water, acetone, and IPA. Samples were exposed to UV-Ozone for 15 min to remove any organic residue. A hole transporter layer of PEDOT:PSS (Clevios Al 4083) was then immediately spin-coated at 4000 rpm for 30 s and dried at 135° C.

for 15 min. The perovskite layer was formed and then the samples were transferred to an $N_2$ glovebox for evaporation (Angstrom Å mod) of the subsequent layers. Buckminsterfullerene ($C_{60}$, MER Corporation) was deposited at a rate of 0.3 Å·s$^{-1}$. Bathocuproine (BCP, TCI) was deposited at a rate of 0.2 Å·s$^{-1}$. Ag deposition (150 nm) was performed through a shadow mask to define the top electrode.

B7.4) Film and Device Characterization

XRD patterns were measured on an X'PERT PRO diffraction system (PANanalytic) equipped with Cu-Kα radiation (λ=1.5406 Å). 2θ-ω scans were recorded in a Bragg-Brentano geometry, with a step size of 0.01° and dwell time of 500 ms for 10°<2θ<50°. A baseline correction was applied to all spectrums to remove the broad feature associated with the glass substrate.

X-ray photoelectron spectroscopy (XPS) measurements were carried out on a PHI 5000 Versaprobe instrument (Physical Electronics Inc., US) equipped with a hemispherical energy analyzer and a monochromatic Al(K$_\alpha$) X-ray source (hv=1486.6 eV) operated at 50 W. The pass energy was fixed at 117.4 eV for survey scans and 23.5 eV for core level spectra, with an analysis area of Ø=200 μm$^2$. The XPS spectra were processed with CasaXPS software and a Shirley-type background was subtracted from the spectra. Peaks were fitted with a Gaussian/Lorentzian (70-30%) line shape.

Scanning electron microscopy (SEM) was performed on a FEI Magellan 400 XHR FE-SEM. Prior to SEM observations, the device samples were coated with 5 nm of Au/Pd (60:40 ratio) to prevent image charging and distortion.

UV-visible absorption spectra of the MAPbI$_3$ perovskite films were obtained with a Cary 6000i spectrophotometer (Agilent Technologies Inc., USA). The tool was calibrated with a blank glass substrate between 300 nm and 1200 nm, with a resolution of 1 nm. Samples were fixed onto a mask with a 1 mm$^2$ circular aperture, and the absorption was measured over the range of calibrated wavelengths.

The photocurrent spectroscopy (i.e. EQE) was performed on photovoltaic devices and recorded as a function of the wavelength using a Keithley model 236. A 100 W tungsten lamp (Newport) was used as the excitation source and focused through a Princeton Instruments SpectraPro 150 monochromator. The monochromatic light was chopped at around 3 Hz and Stanford Research Systems SR830 model lock-ins were used to monitor the perovskite signal at the chopping frequency. Data were averaged for 5 s at each wavelength.

Steady-state photoluminescence was measured using a spectrograph (Acton Research SpectraPro 500i) equipped with a Hamamatsu silicon CCD array detector. The materials were excited with the 457 nm line of an argon ion laser.

Photoluminescence spectra and energy-discriminated carrier decay times were measured using standard photoluminescence and time correlated, single photon counting techniques. Specimens were excited in room temperature air by a nominally 635 nm pulsed laser diode (Picoquant P-C-635M and PDL 800-B) operating at 2.5 MHz and 8·10$^{-5}$ Watts per cm$^2$ average intensity. Photoluminescence spectra near the band edge were measured using a spectrometer (SpectraPro 2750, 500 nm blazed grating) calibrated to persistent Ne lines and a liquid nitrogen cooled Si charged-coupled detector (Princeton Instruments). The time-dependence of the peak photoluminescence wavelength nearest the band edge was measured with a free running Si single-photon detector (Micro Photon Devices) and a PicoQuant PicoHarp 300 counting system. Time-dependent measurements used a 1% count/pulse ratio, and typical instrument response function 1/e decay times are below 1 ns.

All photoluminescence measurements were performed on glass/ITO/PEDOT:PSS/MAPbI$_3$ samples.

Current-voltage measurements were performed using a Keithley model 2400 digital source meter and 300 W xenon lamp (Oriel) solar simulator was used for irradiation. The lamp was calibrated with an NREL-calibrated KG5 filtered Si reference cell. J-V curves were taken over an active area of 0.2 cm$^2$ from forward to reverse bias sampled at 0.05 V intervals with a 0.1 s delay time at each voltage step before taking data.

Gas phase mass spectrometry was performed using an atmospheric pressure real-time gas analyzer (HPR-20 QIC, Hiden Analytical). The gases were collected through a capillary (QIC HT250, Hiden Analytical) located at the same position than the substrate during the spray and formation of perovskite films (i.e. a=4.0 cm).

B7.5) Fracture Energy Measurements

After deposition of the perovskite films, PTAA (Poly[bis (4-phenyl) (2,4,6-trimethylphenyl)amine]) was added as a protective film. Additional bonding layers, 5 nm of chromium and 200 nm of aluminum, were evaporated onto the PTAA surface. The resulting film stack was bonded to a glass beam with a brittle room-temperature cured epoxy adhesive, and cured overnight in a $N_2$ glovebox. Double cantilever beam (DCB) specimens were loaded under displacement control in a thin-film cohesion testing system (Delaminator DTS, Menlo Park, Calif.) from which a load, P, versus displacement, Δ, curve was recorded. The fracture energy, G$_c$ (J/m$^2$), was measured in terms of the critical value of the applied strain energy release rate, G. G$_c$ can be expressed in terms of the critical load, P$_c$, at which crack growth occurs, the crack length, a, the plain strain elastic modulus, E', of the substrates and the specimen dimension; width, b, and half-thickness, h. G$_c$ is calculated from Eq. (3):

$$G_C = \frac{12 P_C^2 a^2}{b^2 E' h^3}\left(1 + 0.64\frac{h}{a}\right)^2. \qquad (3)$$

An estimate of the crack length was experimentally determined from a measurement of the elastic compliance, dΔ/dP, using the compliance relationship in Eq. (4):

$$a = \left(\frac{d\Delta}{dP} * \frac{b E' h^3}{8}\right)^{1/3} - 0.64 * h. \qquad (4)$$

All G$_c$ testing was carried out in laboratory air environment at ca. 25° C. and 40% R.H. The specimen was loaded in tension with a displacement rate of 1.0 μm/s until reaching P$_c$ and then unloaded slightly to determine the compliance before re-loading. This procedure was continued until crack length equals L−4h, where L is the length of the substrate.

C) Extended Data

Figure 9A:
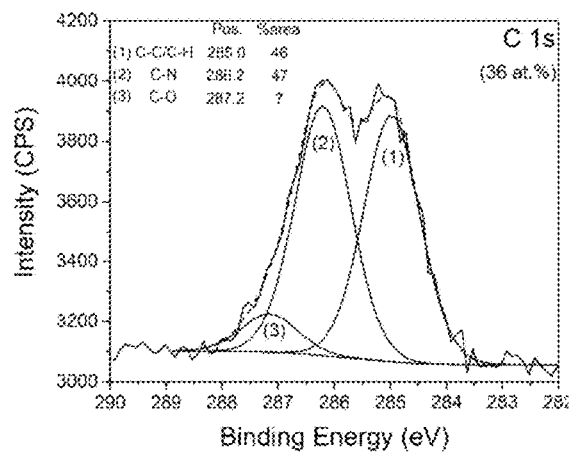
FIGS. 9A-C show X-ray photoelectron spectroscopy curve fitting results pertaining to the experiment of section B.
Figure 9B:
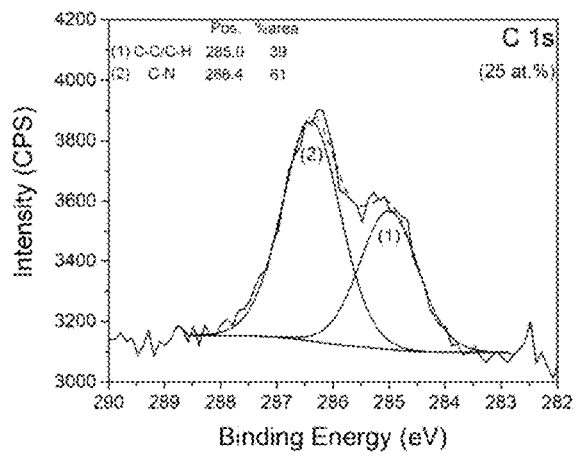
Figure 9C:
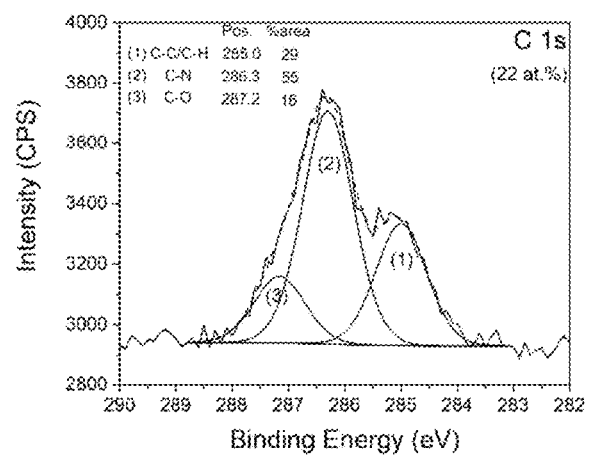

FIGS. 9A-C show XPS curve-fitting of carbon for spin-coated (FIG. 9A), RSPP (FIG. 9B) and hot air-cured (FIG. 9C) films. Alkoxy groups for spin-coated and hot-air cured films are noted but no carboxyl moieties have been detected, meaning no residual acetate groups are present in the layers. In both cases, oxidized hydrocarbons were present only at the top surface of the films. Additionally, aliphatic (C—C bond) and amine (C—N) functional groups were detected for all the films.

Figure 10A:
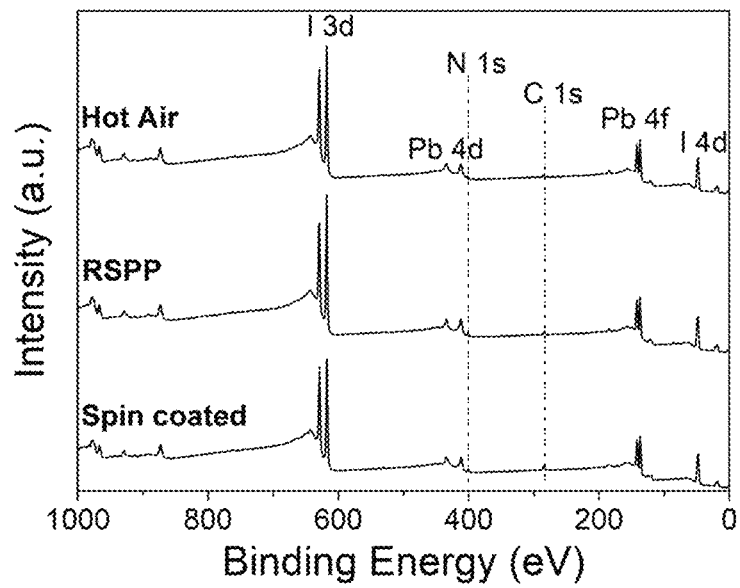
FIGS. 10A-10D show thin film composition measurements relating to the experiment of section B.
Figure 10B:
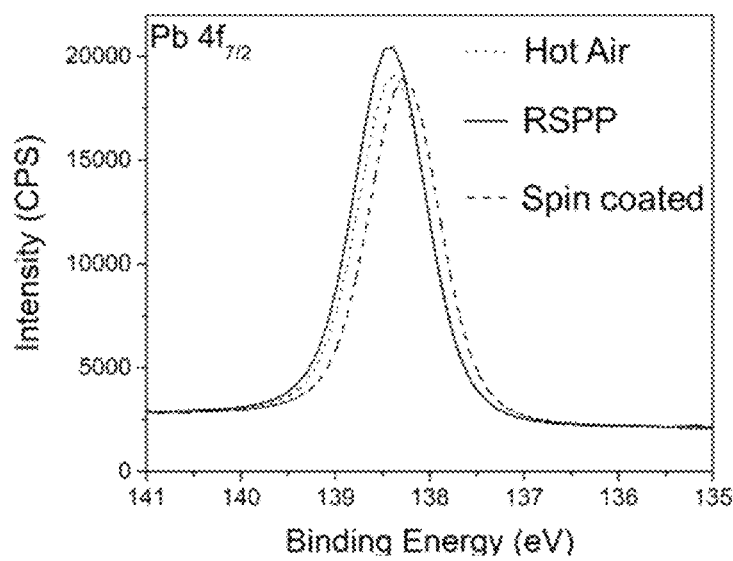
Figure 10C:
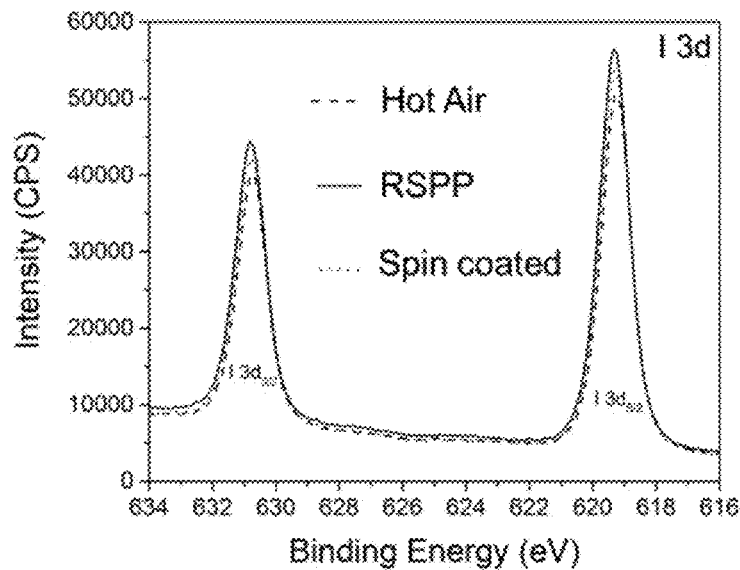
Figure 10D:
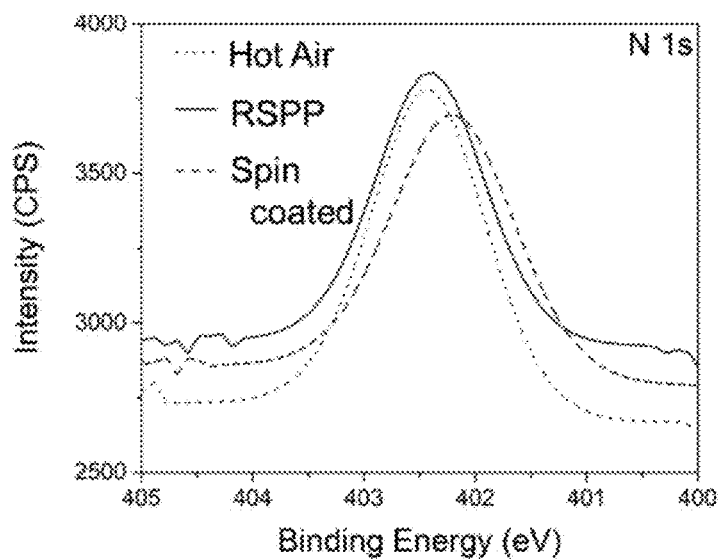

FIG. 10A is an X-ray photoelectron spectroscopy survey spectrum. FIGS. 10B, 10C and 10D show curve-fitting of Pb $4f_{7/2}$, I 3d, and N 1s core-level, respectively, for spin coated, RSPP and hot gas-cured. The experimental signals of Pb $4f_{7/2}$ at 138.4 eV (±0.5 eV) and of I $3d_{5/2}$ and $3d_{3/2}$ at 619.3 eV (±0.05 eV) and 630.8 eV (±0.05 eV), respectively, are consistent with the presence of $Pb^{2+}$ in $PbI_3^-$ and $PbI_2$. No metallic lead was present in the films. The spectral contribution of nitrogen is similar for all the conditions used and is typical of a $MAPbI_3$ structure. The contribution centered around 402.4 eV (±0.05 eV) was attributed to N—C in $CH_3NH_3^{+2}$. No contribution of methylamine ($CH_3NH_2$, ca. 401 eV) was noted, suggesting that the perovskite films have not aged significantly, even in the open air.

FIGS. 11A-B show current density/voltage plots in both forward and backward directions. FIG. 11A is representative of the control device and FIG. 11B is representative of the RSPP device, showing minimal hysteresis in both cases.

FIGS. 12A-B show stabilization of J-V curve parameters representative of the RSPP device. FIG. 12A shows stabilization of photocurrent density and voltage at maximum power point. FIG. 12B shows maximum power point data tracked as a function of time.

Figure 13:
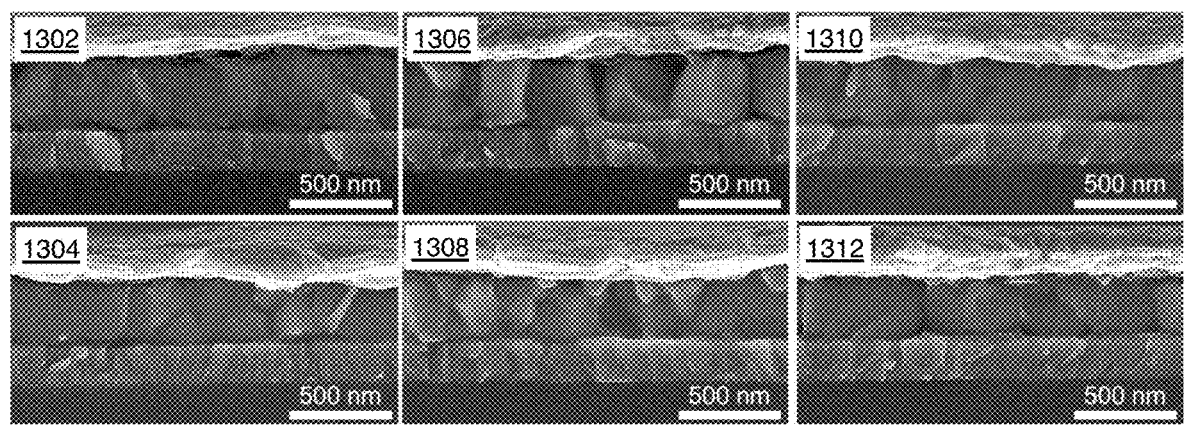
FIG. 13 shows SEM images pertaining to a multi-device experiment of section B.

FIG. 13 shows SEM images of large-scale RSPP of uniform $MAPbI_3$ layers. 1302 and 1304 are representative of the devices that had the highest $J_{SC}$ and the lowest $J_{SC}$, respectively. 1306, 1308 and 1310 are representative of the devices having the highest $V_{OC}$ and FF, the lowest $V_{OC}$, and the lowest FF, respectively. 1312 is representative of the best-performing spin-coated device (PCE=15.4%).

Extended Data Table 1. Relative atomic concentration of carbon, nitrogen, oxygen, lead and iodine, and I/Pb ratio. The gas temperature obtained at a scan speed of 40 mm/s and a nozzle-to-substrate height of a = 40 mm is also indicated. The observed I/Pb ratio values are low considering the ideal stoichiometric value of 3.0, but are still within the tolerant region. This sub-stoichiometry arises from the presence of $PbI_2$ in the films.

|  | Elemental composition (at. %) | | | | I/Pb ratio | Gas temperature (° C.) |
|---|---|---|---|---|---|---|
|  | C | N | Pb | I | | |
| Ideal $MAPbI_3$ perovskite | 16.67 | 16.67 | 16.67 | 50 | 3.0 | — |
| Spin coated | 37 | 11 | 14 | 38 | 2.7 | — |
| RSPP | 25 | 12 | 17 | 46 | 2.7 | 152 ± 4 |
| Hot air | 22 | 11 | 18 | 49 | 2.7 | 155 ± 5 |

EXTENDED DATA TABLE 2

Solar cell device performance parameters. The average and standard deviation values of a batch of 8 identically processed solar cell devices are shown.

|  |  | Current density (mA · cm$^{-2}$) | Open-circuit voltage (V) | Fill factor | Efficiency (%) |
|---|---|---|---|---|---|
| Spin coated | Best-performing cell | 22.4 | 0.98 | 0.70 | 15.4 |
|  | Average ± standard deviation | 21.7 ± 0.6 | 0.93 ± 0.03 | 0.70 ± 0.02 | 14.2 ± 0.6 |
| RSPP | Best-performing cell | 21.8 | 1.05 | 0.69 | 15.7 |
|  | Average ± standard deviation | 21.7 ± 1.1 | 0.97 ± 0.03 | 0.64 ± 0.04 | 13.4 ± 1.7 |

Extended Data Equation 1. Rayleigh number. Thermal energy is transferred to the precursor-solvate through convection with the background gas.

$$R_A = \frac{(g\Delta\rho L^3)}{\alpha\mu} \approx 10^6$$

Here g is acceleration due to gravity, ρ is volumetric mass, L is characteristic length scale, α is thermal diffusivity, and μ is dynamic viscosity.

Extended Data Equation 2. Thermal radiation heat transfer.

$$Q = \sigma \cdot A \cdot (T_{plasma}^4 - T_{solvent}^4) = 24.8 \text{ mJ}$$

Here σ is the Stefan-Boltzmann Constant, A is area, and T is temperature.

Extended Data Equation 3. Temperature increase occurring from thermal radiation heat transfer. The background gas primarily transfers heat to the system via convection.

$$\Delta T = \frac{Q}{(m \cdot C)} \approx 0.1 K$$

Here Q is heat, m is mass, and C is heat capacity.

Extended Data Equation 4. Free energy of a growing particle (homogeneous nucleation).

$$\Delta G = 4\pi R^2 \gamma - \frac{4\pi}{3} R^3 g_v$$

Here R is radius of the growing particle, γ is surface energy of the growing particle, and $g_v$ is free energy associated with the bulk volume.

Extended Data Equation 5. Energy barrier to nucleation.

$$\Delta G^* = \frac{4}{27} \frac{(\sum_i \eta_i \Gamma_i)^3}{(\mu_2 - \mu_1)^2} = \frac{16\pi}{3} \frac{\gamma^3}{g_v^2}$$

Here γ is surface energy of the growing particle, and $g_v$ is free energy associated with the bulk volume.

Extended Data Equation 6. Capacitance. We consider a steady-state situation (d/dt=0) and a fixed particle radius. The perovskite particle is assumed to be an isolated conducting sphere.

$$C_0 = 4\pi\varepsilon_0\varepsilon_r R$$

Here $\varepsilon_0$ is the permittivity of free space, $\varepsilon_r$ is the relative permittivity of the solvent surrounding the perovskite particle, and R is particle radius.

Extended Data Equation 7. Open-circuit voltage.

$$V_{OC} = \frac{k_B T}{q} \ln\left(\frac{J_{SC}}{J_0} + 1\right)$$

Here $k_B$ is the Boltzmann constant, T is temperature, q is the electron charge, $J_{SC}$ is short-circuit current density, and $J_0$ is saturation current density.

Extended Data Equation 8. Dark current.

$$J_0 \sim \frac{qD}{L_{diff}}$$

Here q is the electron charge, D is carrier diffusivity, and $L_{diff}$ is diffusion length.

The invention claimed is:

1. A method of forming an optoelectronically active layer of a perovskite material, the method comprising:
   depositing one or more precursors on a substrate to provide deposited precursors;
   exposing the deposited precursors to a plasma discharge to form the optoelectronically active layer of a perovskite material, wherein the plasma discharge has a pressure between 0.5 atm and 1.5 atm.

2. The method of claim 1, wherein the exposing the deposited precursors to a plasma discharge to form the optoelectronically active layer of a perovskite material provides simultaneous
   a) solvent removal,
   b) precursor bond rearrangement, and
   c) crystallization of perovskite structure, and
   d) evolution of reaction byproducts.

3. The method of claim 1, wherein the exposing the deposited precursors to a plasma discharge to form the optoelectronically active layer of a perovskite material comprises a method selected from the group consisting of: exposing the deposited precursors directly to a plasma discharge, exposing the deposited precursors to an afterglow region of a plasma discharge and exposing the deposited precursors to a plasma jet region of a plasma discharge.

4. The method of claim 1, wherein the plasma discharge is provided by lateral injection.

5. The method of claim 1, wherein the plasma discharge is provided by central injection.

6. The method of claim 1, wherein the plasma discharge is selected from the group consisting of: arc discharges, dielectric barrier discharges, corona discharges, radio-frequency capacitive discharges, microwave discharges, and inductive discharges.

7. The method of claim 1, wherein the depositing the one or more precursors comprises one or more deposition processes selected from the group consisting of: spraying, casting, printing, liquid deposition and vapor deposition.

8. The method of claim 1, wherein the optoelectronically active layer of a perovskite material is configured to be an active layer in a solar cell.

9. The method of claim 1, wherein the optoelectronically active layer of a perovskite material is configured to be an active layer in a light emitting device.

10. The method of claim 1, wherein the optoelectronically active layer of a perovskite material is configured to be an active layer in a light detecting device.

11. The method of claim 1, wherein the optoelectronically active layer of a perovskite material is configured to be an active layer in a water splitting system.

12. The method of claim 1, wherein the optoelectronically active layer of a perovskite material is configured to be an active layer in a non-linear optoelectronic device.

13. The method of claim 1, wherein the optoelectronically active layer of a perovskite material is configured to be an active layer in a photostriction-based device.

14. The method of claim 1, wherein the plasma discharge is open to ambient air.

15. The method of claim 1, wherein the plasma discharge is contained within an enclosure providing a controlled atmosphere.

* * * * *